(12) United States Patent
Lin et al.

(10) Patent No.: US 11,165,387 B2
(45) Date of Patent: Nov. 2, 2021

(54) CURRENT CYCLICAL TESTING FOR PV ELECTRICAL CONNECTIONS

(71) Applicant: SunPower Corporation, San Jose, CA (US)

(72) Inventors: Yafu Lin, San Jose, CA (US); Ryan Reagan, Hayward, CA (US); Itai Suez, Hercules, CA (US); Katherine Han, San Jose, CA (US); Hai-Yue Han, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 60 days.

(21) Appl. No.: 16/807,312

(22) Filed: Mar. 3, 2020

(65) Prior Publication Data
US 2021/0281215 A1    Sep. 9, 2021

(51) Int. Cl.
*H02S 50/10* (2014.01)
*G01R 31/66* (2020.01)
*H02S 40/36* (2014.01)

(52) U.S. Cl.
CPC .............. *H02S 50/10* (2014.12); *G01R 31/66* (2020.01); *H02S 40/36* (2014.12)

(58) Field of Classification Search
None
See application file for complete search history.

(56) References Cited

U.S. PATENT DOCUMENTS 7,478,741 B1 * 1/2009 Newman .............. G01R 31/71
228/103

| 9,666,739 | B2 | 5/2017 | Harley |
| 9,691,924 | B1 | 6/2017 | Rose et al. |
| 10,090,421 | B2 | 10/2018 | Harley et al. |
| 2016/0149065 | A1 | 5/2016 | Pass |
| 2019/0305167 | A1 | 10/2019 | Sewell et al. |
| 2019/0312156 | A1 | 10/2019 | Lu et al. |
| 2019/0312166 | A1 | 10/2019 | Lu et al. |

FOREIGN PATENT DOCUMENTS

WO    WO2015183827 A2    12/2015

OTHER PUBLICATIONS

Pavel Mach et al., 2nd Electronics System—Integration Technology Conference, Greenwich, UK, 2008, pp. 305-308.
N. Helmold et al., Determining the Lifetime of Silver-Filled Isotropic Conductive Adhesive (ICA)/Solder Plated Interconnections, CALCE Electronic Products and Systems Center, pp. 1-7.
David Okawa et al., Automated Manufacturing of Innovative CPV/PV Modules, Cogenra Solar, 2016, pp. 1-21.
Peggy Feng, Electrically Conductive Adhesives for PV Applications, SNEC 10th International Photovoltaic Power Generation Conference and Exhibition, May 14, 2016, pp. 1-14, DuPont Photovoltaic and Advanced Materials, Shanghai, China.
Darryl J. Small, Reliability Considerations of Electrically Conductive Adhesives, Loctite Electronics Technical Paper, pp. 1-9, Loctite Corporation.

* cited by examiner

*Primary Examiner* — Jas A Sanghera
(74) *Attorney, Agent, or Firm* — Grasso PLLC

(57) ABSTRACT

Cyclical testing of electrically conductive bonding (ECB) is provided. Cyclical testing comprises high current flows using multiples of max operating currents and monitoring sensors with periods of no current to accelerate testing of electrical connections employing ECBs.

20 Claims, 17 Drawing Sheets

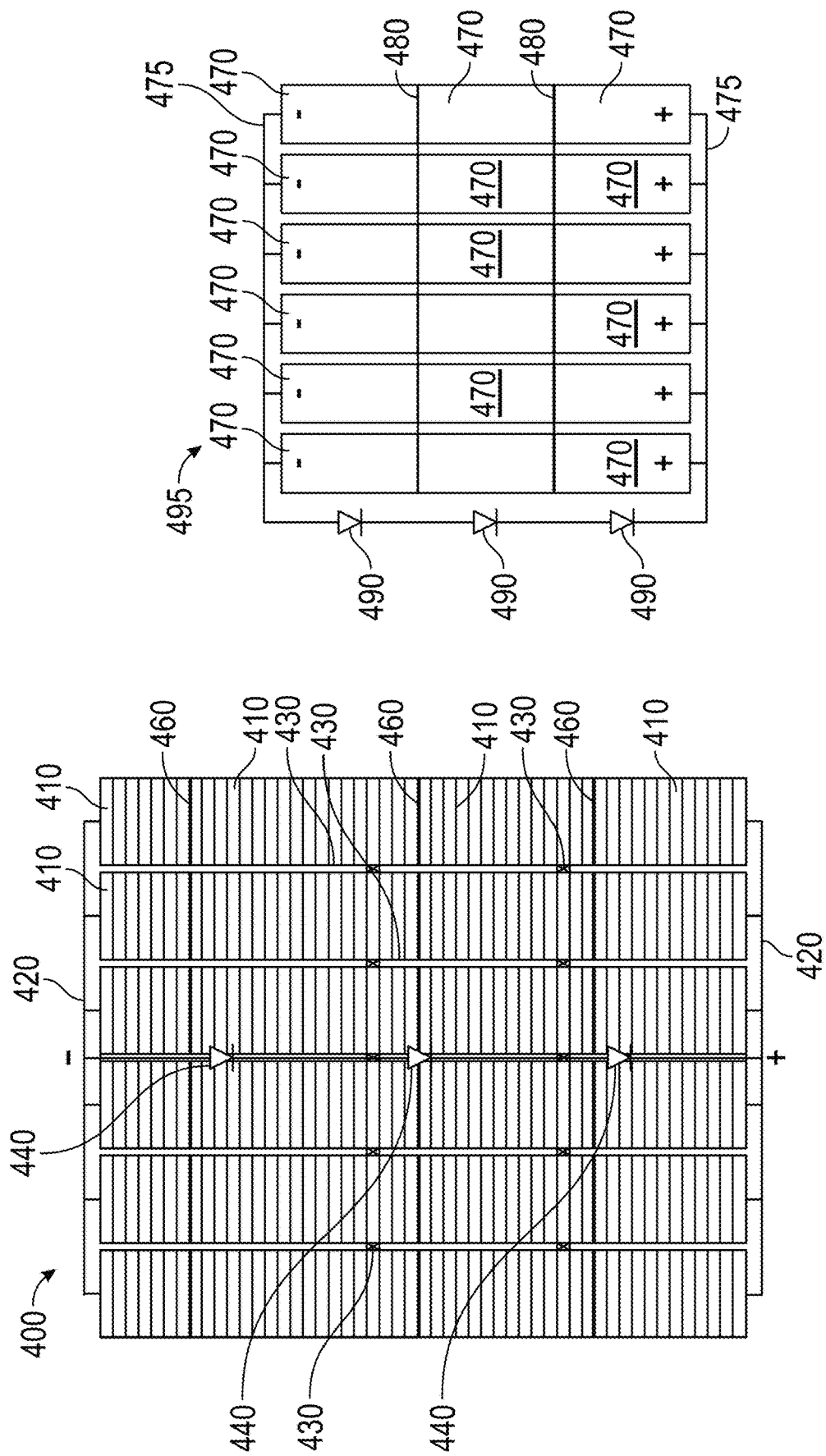

CURRENT CYCLICAL TESTING FOR PV ELECTRICAL CONNECTIONS

STATEMENT REGARDING FEDERALLY SPONSORED RESEARCH OR DEVELOPMENT

This invention was made with government support under DE-EE0007190 awarded by the U.S. Department of Energy. The government has certain rights in the invention.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

PV modules can comprise a plurality of PV cells along with a supporting structure and Module Level Power Electronics (MLPE). The cells may be electrically connected to each other to form a larger PV Panel. The voltage output of this PV panel may be fed to MLPE of a PV module as well as to other locations. The cells may be connected to each other during manufacturing. Likewise, the cells may be connected to MLPE during manufacturing.

BRIEF DESCRIPTION OF THE DRAWINGS

FIG. 4B illustrates a top down view of a PV panel with shingled PV cells including cell-to-cell electrical connections that may be cyclically tested according to some embodiments.

FIG. 4C illustrates a top down view of a multi-bus bar electronic test piece with electronic connections that may be cyclically tested according to some embodiments.

DETAILED DESCRIPTION

Figure 1:
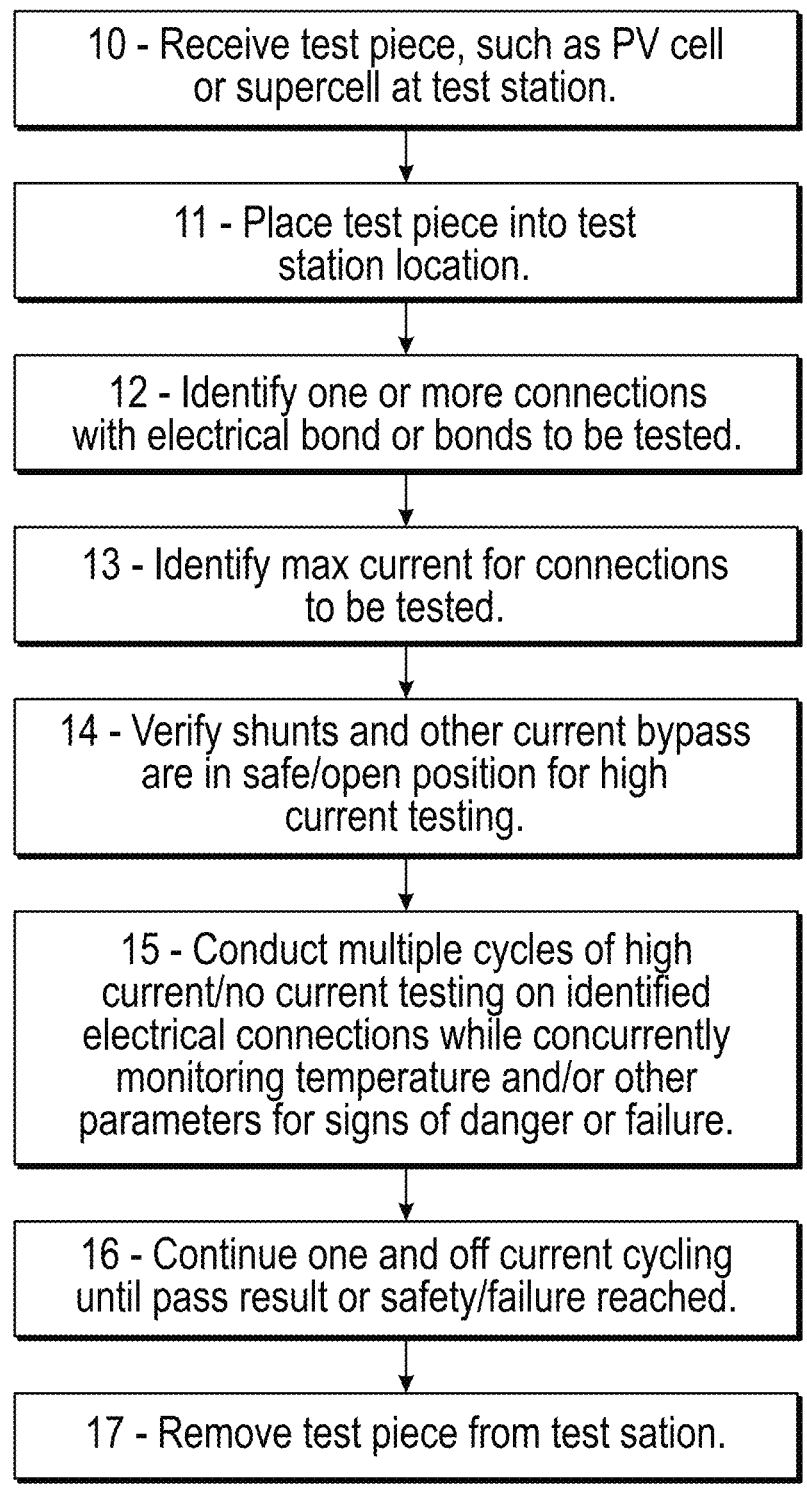
FIG. 1 illustrates process features for cyclically testing an electronic or photovoltaic (PV) test piece, such as a PV cell, PV string or PV module, with electrical connections as may be employed according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112(f) for that unit/component.

"First," "Second," etc. As used herein, these terms are used as labels for nouns that they precede, and do not imply any type of ordering (e.g., spatial, temporal, logical, etc.). For example, reference to a "first" electrical component of a test piece does not necessarily imply that this electrical component is the first electrical component in a sequence;

instead the term "first" is used to differentiate this electrical component from another electrical component (e.g., a "second" electrical component).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification describes exemplary testing processes, apparatus, and systems that may be used to cyclically test electrical connections in various electronic test pieces. In one implementation, the electronic test piece is a photovoltaic (PV) device that can generate electricity from sunlight via an electronic process that occurs in a semiconductor material of the PV device. Solar-generated electrons in the PV semiconductor materials of the PV device can be routed through one or more electrical connections and/or circuits of the PV device to power other electrical devices and/or send electricity to the grid. Various features or parameters of embodiments are provided and then followed by descriptions of specific figures with processes, devices, and systems. The features and parameters provided herein may be used in various ways, may not be used, and may be used in whole or in part across and among embodiments, including those embodiments provided herein. Associated with this detailing are more detailed explanation of various embodiments of conductive contact configurations.

Electrical connections may be made by various Electrically Conductive Bond(s) (ECB(s)). These conductive bonds may comprise one or more of: conductive materials, binder materials, materials with adhesive properties; and/or combinations of the foregoing. Thus, embodiments can provide or produce ECBs to create a mechanical and/or electrical bond or connection formed during a manufacturing process and intended to be permanent within the final test piece, such as a PV device like a cell string, solar module, or other electrical connection. The electrical and mechanical bond between components of an electronic test piece may be via welding (e.g. direct component-to-component bond like a direct cell-to-cell or cell-to-wire bond) or via an intervening electrically conductive bonding material or other electrically conductive binding pathway or medium. The ECB may be created during manufacture and may be used to connect wires or components to one another in an electronic component or device. The ECB may provide a conductive path and may have certain characteristics after being placed. These characteristics can include electrical pathway properties as well as mechanical binding properties. The electrical pathway properties may include resistance, impedance, thermal radiance, max-current, and short-circuit current. The mechanical properties can include flexibility, adhesion, thermal conductivity, durability, and toughness. ECB examples comprise metals, metal foils, lead alloy solders, lead-free solders, silver alloy solders, metallic alloy solders, electrically conductive adhesives, as well as combinations thereof.

ECB may be used in embodiments to provide an electrical pathway between two adjacent electrically connected electrical or electronic components. These components may be, for example, a diode and a ribbon trace of a printed circuit board, ribbon traces of adjacent photovoltaic panels or photovoltaic cells, wires leading to or from an electrical or electronic component, two or more solar cells, a solar cell and an solar device interconnect, and sequential wire connections mounted on a flexible substrate, as well as many other electrical connections. Some ECBs may have various thermal bonding temperatures, may adhere or not adhere to many different substrates, may provide multiple low-temperature processing options, may be reworked after initial setting, may use silver or metal other than lead as a conductor, and may employ a binder to support conductive particles of the ECBs. Other properties may also exist. The various constituents of different ECBs provide for different properties among ECBs, including durability, toughness, flexibility, brittleness, electrical performance, and thermal resiliency.

ECB connections may include wire structure connections, foil structure connections, dog bone PV cell-to-cell connections, and other connections as well. Once electrical components are connected using ECB, the viability of the connected components and the system in which they are a member, can depend on the performance of the ECB connections. Embodiments can provide cyclical testing parameters, systems, and processes that may be used to determine the viability of ECB electrical connections in a test piece. This viability may be determined for short periods of time such as days, weeks, months, and for longer terms, such as years and decades. Through embodiments, longevity of ECB electrical connections may be tested and in so doing viable ECB materials and electrical connection configurations may be tested for suitability in a specific application. For example, embodiments may be employed when testing ECB connections of shingled solar cells, which may be named hypercells or super cells, and may be used to select suitable binding materials and suitable conductive particles of an ECB for an exposed application in potentially harsh external installation environment. A string of shingled solar cells, i.e., a string of cell strips, as noted, may be referred to as a super cell or a hypercell. Accordingly, hypercells or super cells contain electrical connections between each shingled member of their cell groupings and these electrical connections may contain ECB material (e.g. intervening foils, electrically conductive adhesives and so on).

Embodiments may characterize, specifically identify, or otherwise determine how much localized heating and high current flow can be tolerated in electrical ECB connections of a test piece. These connections may be series connections of mini bus bars or surface metallization of PV cells, series connections of adjacent PCB traces, isolated ECB connections of electrical components to one another, as well as numerous other ECB connection applications. ECB may be screened in a condensed time frame rather than waiting over a lifetime for durability, traditional thermal cycling, or other failure screens. Cyclical testing of embodiments may also serve to specify ECB binders or other materials that are suitable in different stress and temperature conditions. In other words, the accelerated current cycling of embodiments may be suitable to identify which ECB materials are better suited for high current applications, low current applications, high thermal stress applications, low thermal stress applications, etc.

Embodiments may employ cycling high current on and off through a solar module, or series of cells, or hypercells, or another test piece containing ECB connections. Embodiments may use the resistance of the ECB to directly heat the ECB connections and use cycles of current and non-current to simulate dozens, to hundreds, to thousands, of cycles-per-day with temperature swings similar to some field conditions. In so doing, embodiments may place specific focus on concentrating high stresses, electrically, thermally, and otherwise, to the ECB material and the ECB connections themselves. Real-time data analysis as well as stored data analysis may be used for screening of comparable ECB materials and ECB connection designs.

Embodiments may employ test chambers with cooling systems, thermal sensors, smoke sensors, vibratory sensors, and other sensors, and power systems, each managed or monitored by a management controller or controller system. The test chambers may be configured to hold test pieces, such as multiple solar modules, multiple sets of PV cells, and a cooling system. The test chambers in embodiments may be wired for current delivery to the test pieces and for data communications between the chamber and an interface or interfaces where the interface may have control connections to fans, sensors, and power supplies of the test chamber. The power supplies may be connected to provide high current to each of the test pieces in the test chamber. Various numbers of power supplies may be employed and can include a single power supply, as well as two, three, four, eight, twelve, twenty-four, or more power supplies as well as any amount of intervening numbers of power supplies in these ranges as well. In embodiments, the power supplies may be cycled on and off for periods of time and the temperature, and voltage and current, through each of the tested test pieces, as well as through individual ECB connections of the test pieces, may be monitored over time during the loading and quiescent cycles. A multiple of max operating current (maximum short circuit current of PV cell device at 1000 watts/square meter is referred to as $I_{scmax}$) for each test piece may be generated by the power supplies and provided to the test pieces. To prevent destruction of non ECB connections or components, shunts or temporary bridges may be installed on the test piece to shield non-ECB connections or a portion of the ECB connections from the high currents being imposed by the power supplies. Over time, these high-currents, when cycled on and off, and the reactions of the ECB connections may be monitored, and may identify ECBs and connection configurations that are suitable for a particular test piece configuration. The high current multipliers may be various multipliers of max short circuit current and may include $1 \times I_{scmax}$, $2 \times I_{scmax}$, $3 \times I_{scmax}$, $4 \times I_{scmax}$, $5 \times I_{scmax}$, $6 \times I_{scmax}$, $7 \times I_{scmax}$, $8 \times I_{scmax}$, $9 \times I_{scmax}$, $10 \times I_{scmax}$ as well as variations within these currents, or more or less and in varying degrees. By using a multiplier of max short circuit current, testing of ECB connections may be accelerated and various configurations, components, and designs may be evaluated. This evaluation may be for purposes of design testing, manufacturing quality control, and for other reasons as well.

During off periods, fans or other cooling systems may be employed to lower the ECB connection temperature back to room temperature or to another desired temperature. During both no current and imposed current cycles measurements may be taken periodically, and spontaneously of the current, voltage, and temperature on each test piece as well as on sample individual ECB connections. If the test poses a safety risk, as detected by samples reaching an ultimate max temperature, smoke sensors sensing smoke, the interface becoming unresponsive, a test administrator hitting a manual emergency stop, or other threshold being crossed, the output from the power supplies may be turned off or reduced and the test may be halted or truncated or otherwise altered.

The test may be performed over numerous cycles per day and may be performed with a specific focus of concentrating damage to the ECB connections. A test cycle count can include 5, 10, 50, 120, 250, 500, 1000, intervals therebetween, and more. A single test cycle can comprise a period of time of no current followed by a period of time of imposed current. The durations of imposed current and no current may be different in single test cycles as well as in grouping of test cycles. The durations of imposed current and no current may also be the same in single test cycles as well as in groupings of test cycles. Imposed current may be imposed for periods of seconds, minutes, and hours, while non-current quiescent times may also be imposed for periods of the same number of or different number of seconds, minutes, and hours. For example, forward bias currents may have active imposed periods of 3, 4, 5, 6, 7, 8, 9, or 10 minutes while a corresponding non-current period during the same cycle test may have durations of 1, 2, 3, 4, 5, 6, 7, or 8 minutes. Thus, no current testing durations may be shorter than imposed current testing durations in embodiments. This shorter no current duration may result in near return of temperature of an ECB connection or test piece and may allow for more test cycles to be completed on a test piece or ECB connection over a period of time.

A temperature range during each single cycle on a test piece or ECB connection may be created from imposed current to no current with cooling. This temperature range may be 5° C., 10° C., 15° C., 20° C., 25° C., 30° C., 35° C., 40° C., 45° C., 50° C., 55° C., 60° C., 65° C., 70° C., 75° C., 80° C., 85° C., 90° C., 95° C., 100° C., 105° C., 110° C., 115° C., 120° C., 125° C., 130° C., temperature intervals therebetween, and more or less. In so doing temperature swings for 24-hour day, may be simulated and concurrent real-time data analysis of temperature, voltage, current may be used to provide early detection of problems or differences in designs. When an ECB connection of an ECB test piece is isolated in testing, a threshold range for temperature deltas or voltage performance or current performance may be set and pass/fail grades may be assigned to particular ECB connections or ECB test pieces using the cycling loading and unloading of high current. Tests may be concluded upon a failure of the ECB connection or test piece as well as upon successful completion after a set number of cycles. An ECB connection or ECB test piece may be considered to pass the testing even when a failure occurs if the number of cycles survived before failure is large, for example, if 125, 250, 500, 750, 1,000, 2,000 or more cycles are successfully survived, a subsequent failure may nevertheless be deemed a pass given the length of testing endured before failure.

During imposed current test cycles, absolute voltage generated by the power supplies to the ECB test pieces may depend upon test piece chemistry, PV test piece chemistry, the amount of ECB material used, the location and configuration of the ECBs used, the length of cabling feeding the test pieces and within the test pieces and other parameters as well. Degradation of test piece components may result in a trend in increased voltage during testing as the time into an imposed current cycle increases. This voltage may be graphed vs. cycle number to infer changes in series resistance in order to determine whether or not an ECB passes or fails. The number of full cycles to be run may be determined through extrapolation using a test piece and determining a minimum number of full test cycles to be run in which one or plateaus appear with little or no change in the rate of degradation or a suitable and predictable change in the rate of degradation is shown. Also, the number of full cycles run may depend on estimated acceleration factors for a test and a test sample as well as a mission profile (e.g., an environment and duration where the solar module or other test piece is anticipated to function). The test can also be used as a comparative method by benchmarking a result based on a known sample design and saying that something that performs better passes and something that performs worse fails. By knowing or predicting the rate of degradation in an ECB connection, its expected life duration may be predicted or a minimum duration for the ECB connection or an ECB test piece may be predicted. If these life durations or minimum durations are acceptable the ECB connection parameters may be deemed acceptable. Conversely, if these life durations or minimum durations are not acceptable the ECB connections parameters or the ECB test piece may be deemed unacceptable. During these degradation tests, the ambient temperature may be adjusted and the cooling effects may be adjusted as well. For example, ambient temperature may be lowered through the use of fans, while additional cooling effects, from cooling liquids near the ECB connections, may also be imposed to lower temperatures during testing.

Physical inspection of ECB connections or ECB test pieces, during and after testing cycles, may also be performed in embodiments. This physical inspection may include visual inspection, for burns or discoloration or disfiguration, and touch inspection for disfiguration. Inspections may also include flash (light) IV curve tracing, electroluminescence imaging, and IR imaging during current bias, as well as visible inspection. These inspections may be performed manually as well as with optical or other kinds of sensors.

Safety circuits, such as a kill circuit, may be employed to provide protection from the high-currents. These safety circuits may include smoke sensors, open door sensors, over-temperature sensors, and other safety sensors as well. These sensors may be located in and/or around a test chamber. Once activated, the testing may cease or be paused until the alert condition can be remedied.

In embodiments, the voltage from the power supplies during an imposed current on cycle may depend on cell chemistry, the amount of ECB used/number of ECB connections, the length of cabling, or other variables. As a test progresses, the imposed current and no-current cycle voltage ranges may change as degradation begins to occur in the ECB. Likewise, effects of cycle number on voltage (proportional to Rs increase with age/time) may stabilize around 250, 500, 750, or 1,000 cycles and then increase with further age.

Embodiments may comprise an apparatus or a system or process that perform functions or portions of functions described above or below. These functions may comprise determining whether a number of complete test cycles of ECB on an ECB test piece has been reached or has not been reached, the ECB test piece located in a test chamber. If a determination is made that the number of complete test cycles has not been reached, functions may include performing a no current test on the ECB test piece for a first period of time and performing an imposed current test on the ECB test piece during a second period of time and, during the imposed current test, receiving and analyzing signals from thermal sensors and voltage sensors or current sensors, the thermal sensors and voltage sensors or current sensors sensing temperature, and voltage or current, of one or more ECB connections on the ECB test piece. Functions performed may also include commanding a power supply to provide a high-current to the one or more ECB connections, the high-current exceeding the maximum short-circuit current for at least one ECB connection of the one or more ECB connections.

In embodiments, the system or apparatus or process may further comprise, during the imposed current test, comparing the received signals to a safety value, and when a received signal exceeds a safety value threshold, to stop commanding the power supply to provide the high-current. In some embodiments, the second time period may be longer than the first time period. In some embodiments, the temperature may be determined during the no current test and active operation of a cooling system in the test chamber may be maintained. In some embodiments, the cooling system may be sized to lower the temperature of one or more ECB connections on the ECB test piece. In some embodiments, the processing unit may perform functions further comprising: determining the temperature and voltage or current for each ECB connection of the ECB test piece and the ECB test piece may comprise a plurality of photovoltaic cells. In some embodiments, during the imposed current test, the signals from thermal sensors and voltage sensors or current sensors may be received via a test chamber interface, the interface comprising a processing unit and electrically coupled to the thermal sensors, and the voltage sensors or the current sensors, of the test chamber. In some embodiments, the high-current may exceed three-times the maximum short-circuit current for at least one ECB connection of the one or more ECB connections. In some embodiments, the high-current may exceed six-times the maximum short-circuit current for at least one ECB connection of the one or more ECB connections.

Likewise, in embodiments, a determination of whether a number of complete test cycles of electrically conductive adhesive on an ECB test piece has been reached or has not been reached may be made. If a determination is made that the number of complete test cycles has not been reached, performing a no current test on the ECB test piece for a first period of time and performing an imposed current test on the ECB test piece during a second period of time may be performed. During the imposed current test, receiving and analyzing signals from thermal sensors and voltage sensors or current sensors may be performed with the thermal sensors and voltage sensors or current sensors sensing temperature, and voltage or current, of one or more ECB connections on the ECB test piece. Still further, embodiments may comprise commanding a power supply to provide a high-current to the one or more ECB connections, the high-current exceeding the maximum short-circuit current for at least one ECB connection of the one or more ECB connections and further comprise, during the imposed current test, comparing the received signals to a safety value, and when a received signal exceeds a safety value threshold, to stop commanding the power supply to provide the high-current.

FIG. 1 illustrates process features for cyclically testing an electronic test piece, such as a laminated PV cell string or PV module, with electrically bonded connections according to some embodiments. FIG. 1 shows that embodiments may include processes where a test piece is received at a test station and this test piece may be a PV string or PV module as well as other electrical or electronic component or device with one or more ECB connections. At 11 and 12, the test piece may be placed in the test station and the ECB connection to be tested may be identified. Prior to testing, as shown at 13, the max current for the ECB connections may be identified and as shown at 14, shunts or other current bypasses may be opened to protect areas of the test piece that can be harmed by high test current. At 15, multiple on and off cycles of a multiple of max current may be applied to the test piece. Concurrently, the test piece may be observed and tested for failure or safety reasons. Should a safety threshold be breached or a failure occur, the testing may stop. As shown at 16, testing may continue otherwise until a set number of off and on cycles is completed. Once the testing is complete, the test piece may be removed from the test station, as shown at 17.

Figure 2A:
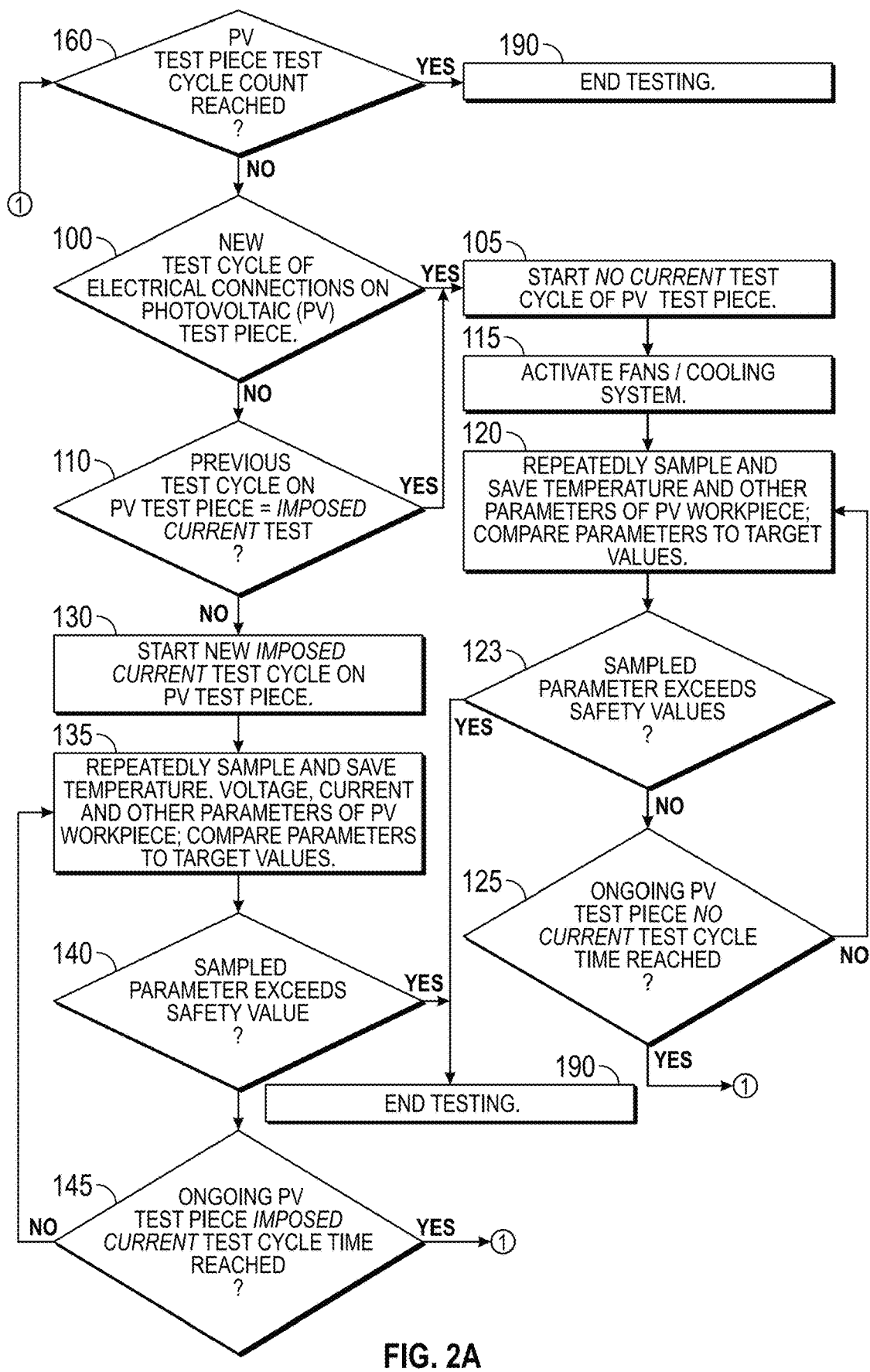
FIG. 2A illustrates process features for cyclically testing a PV test piece with electrical connections as may be employed according to some embodiments.

FIG. 2A illustrates process features for cyclically testing a PV test piece with ECB as may be employed according to some embodiments. An ECB test piece may be loaded into a test chamber or other test location and a new test cycle may begin at 100. At 105 a new no current test cycle of the ECB test piece may begin. This no current test cycle may include calibrating sensors in the test chamber as well as receiving initial setting for each of the sensors in or around the test chamber involved in the test cycle. At 115, the cooling system may be activated to cool off or maintain the ECB test piece at a desired resting temperature. This resting temperature may be room temperature or another desired temperature. Once the cooling system is activated, repeated sampling and saving of sensor readings may be performed by an interface and a test manager controller. This repeated sampling and saving is shown at 120. Also, at 120, periodic comparisons may be performed by the interface or the test manager controller or both during the repeated sampling. If during this sampling and comparison a safety threshold is crossed, testing may stop as shown at 123 and 190. Provided that cooling and the no current cycle continues within limits, repeated sampling may occur, as shown at 125 and 120. Once the desired amount of time for cooling has passed, as shown at 125, the process may move to consider whether the total number of full cycles have been counted as shown at 160.

Likewise, at 110, if the previous test cycle on an ECB test piece was a no current test cycle then the next test cycle will involve an imposed current test cycle. This subsequent test cycle start is shown at 130. 135 shows the repeated sampling and saving of sampled parameters during the imposed current test cycle. Should a sampled parameter exceed a safety threshold, as shown at 140, the testing may end, as shown at 190. Ahead of ending the testing, the cooling system may be activated for a period of time in some embodiments to determine if additional thermal cooling can maintain temperatures below a safety threshold value. Ongoing sampling and saving of temperature, voltage, current or other parameter may continue until a cycle time is met, as is shown at 145. If the cycle time is not met, then the cycle repeats back to 135. If the cycle time is met, then the counter at 160 is checked to determine whether enough full cycles have been performed.

In embodiments, safety thresholds may include temperature differences of 40° C.-60° C. above ambient temperature. As noted above, a target number of combined no current and imposed current test cycles can vary from 10, to 50, to 100, 120, 150, 250, 500 or more full test cycles per day.

Figure 2B:
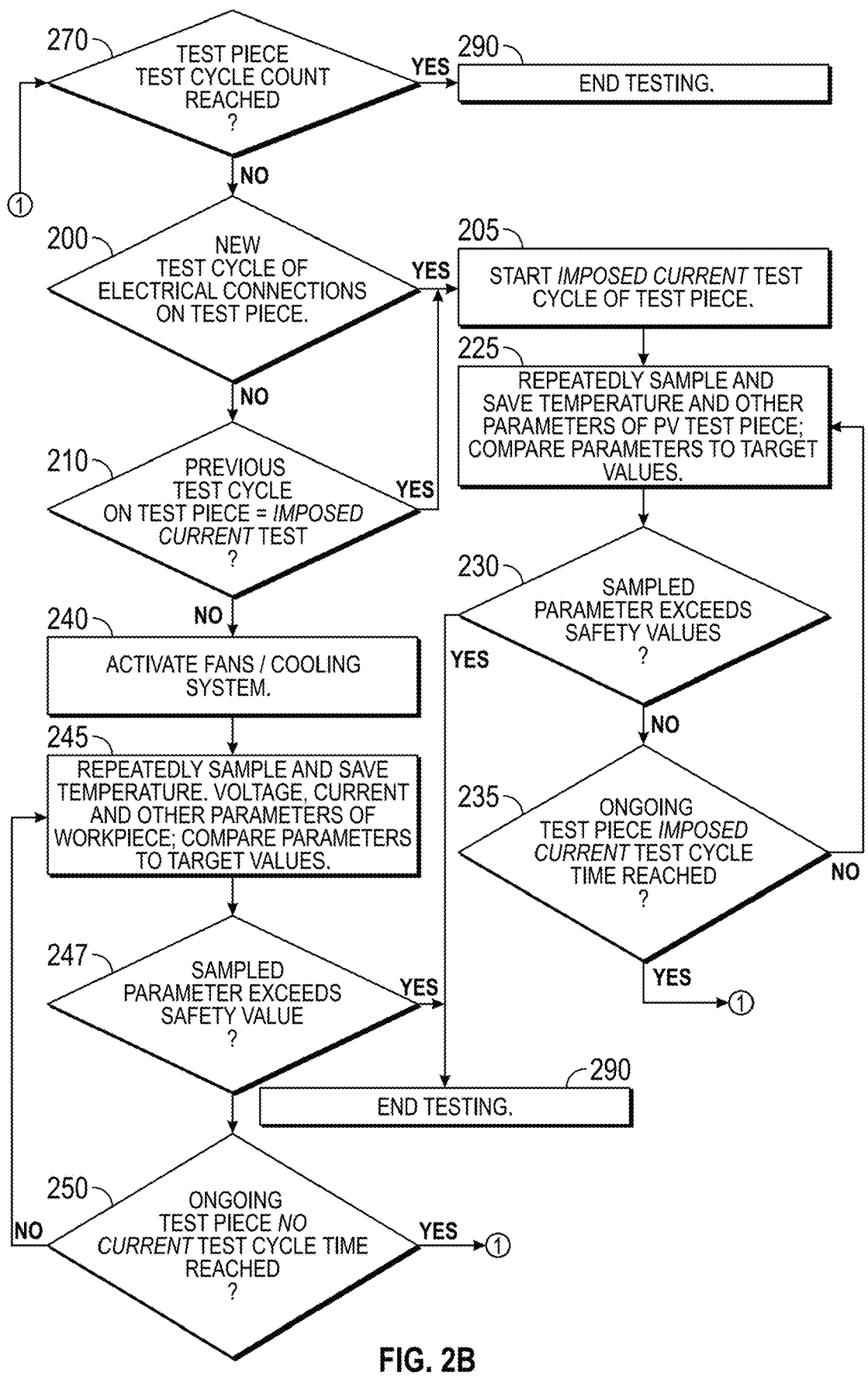
FIG. 2B illustrates process features for cyclically testing an electronic test piece with electrical connections as may be employed according to some embodiments.

FIG. 2B illustrates process features for cyclically testing a test piece with ECB as may be employed according to some embodiments. An ECB test piece may be loaded into a test chamber or other test location and a new test cycle may begin at 200. At 205 a new imposed current test cycle of the ECB test piece may begin. This imposed current test cycle may include calibrating sensors in the test chamber as well as receiving initial settings for each of the sensors in or around the test chamber involved in the test cycle. 225 shows the repeated sampling and saving of sampled parameters during the imposed current test cycle. Should a sampled parameter exceed a safety threshold, as shown at 230, the testing can end, as shown at 290. Ongoing sampling and saving of temperature, voltage, current or other parameter may continue until a cycle time is met, as is shown at 235. If the cycle time is not met, then the cycle repeats back to 225. If the cycle time is met, then the counter at 270 is checked to determine whether enough full cycles have been performed.

Likewise, at 210, if the previous test cycle on an ECB test piece was an imposed current test cycle then the next test cycle will involve a no current test cycle. This subsequent test cycle start is shown at 240. At 240, the cooling system may be activated to cool off or maintain the ECB test piece at a desired resting temperature. This resting temperature may be room temperature or another desired temperature. Once the cooling system is activated, repeated sampling and saving of sensor readings may be performed by an interface and a test manager controller. This repeated sampling and saving is shown at 245. Also, at 247, periodic comparisons may be performed by the interface or the test manager controller or both during the repeated sampling. If during this sampling and comparison a safety threshold is crossed, testing may stop as shown at 290. Provided that cooling and the no current cycle continues within limits, repeated sampling may occur, as shown at 250 and 245. Once the desired amount of time for cooling has passed, as shown at 250, the process may move to consider whether the total number of full cycles have been counted as shown at 270.

Figure 3:
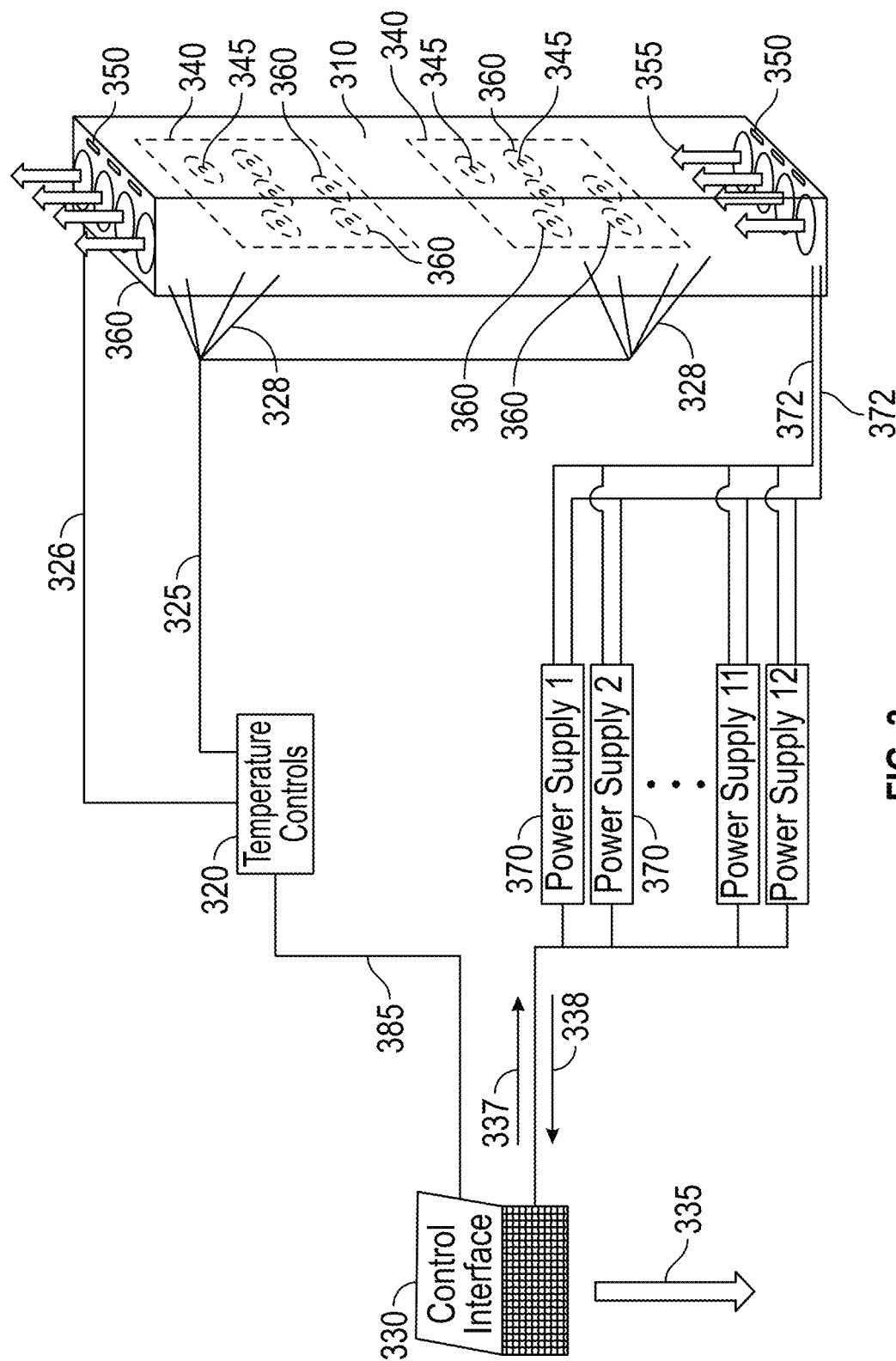
FIG. 3 illustrates a system for cyclically testing an electronic test piece with electrical connections as may be employed according to some embodiments.

FIG. 3 illustrates a system for cyclically testing an electronic test piece with ECB as may be employed according to some embodiments. Systems of embodiments may include a test manager controller 330, a test chamber interface 320, sensor control/data lines 325, data/control lines 326, sensors 360, power supplies 370, current on/off control data flows 337, rad current/voltage data flows 338, power feed lines 372, fans 350, and test chambers 310. Also labelled in FIG. 3 are the ECB test pieces 340, the ECB connections 345, data flows 338, and airflow 355. In use, a test piece 340 may be placed in the chamber 310. The interface 320 may interact with the sensors 360 and the fan 350 or other cooling system and may exchange data 385 back and forth with controller 330. The controller and or the interface 320 may perform operations consistent with those in FIGS. 1 and 2. In some embodiments, the power supplies may comprise a 10 A, 60V power supply or other configuration to supply about 6 kW total power to the ECB test pieces and the fans 350 may be managed via 16 temperature sensors 360 to maintain hot and cold temperatures during the test cycles. The sensors 360 may also comprise smoke sensors, and over-temperature sensors as well as sensors to determine the status of the chamber 310, such as open door or other physical chamber status. Emergency off (EMO) switches may be mounted on the rack box of power supplies 370 as well as on the chamber 310 itself.

Figure 4A:
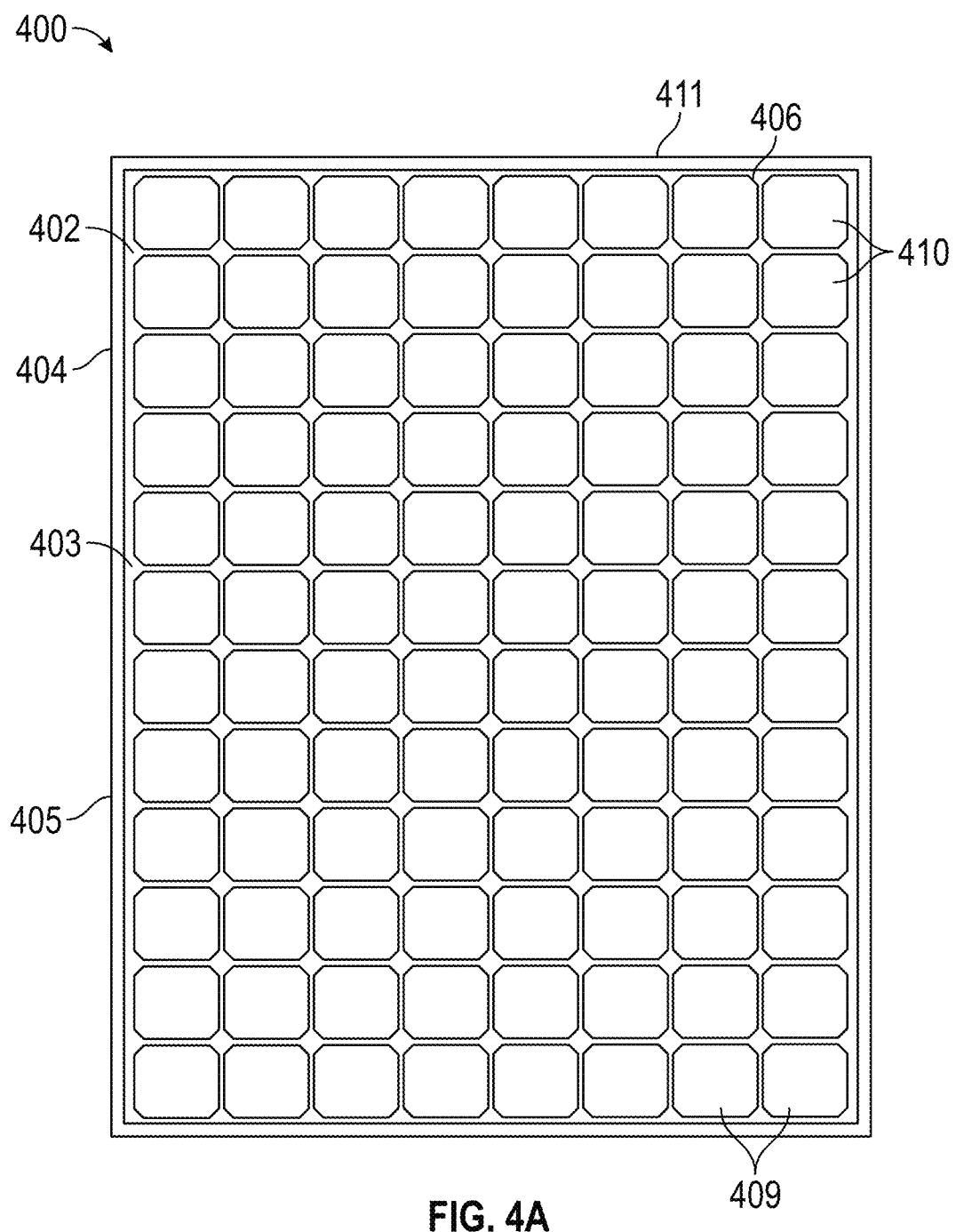
FIG. 4A illustrates a top down view of a PV panel comprising pseudo-square PV cells including cell-to-cell electrical connections that may be cyclically tested according to some embodiments.

FIG. 4A illustrates a top down view of a PV panel ECB PV test piece 400 with PV cells 410 where the PV cells use ECB to electrically connect them to each other and which may be cyclically tested according to some embodiments. The PV panel or module 400 comprises a PV laminate 406 having a front side 402 that faces the sun during normal operation to collect solar radiation and a back side 404 opposite the front side 402. The module 400 comprises a laminate 406 encapsulating a plurality of solar cells 408. In some embodiments, the PV panel or module 400 can be 'frameless.' However, in other embodiments, module 400 comprises a support member or frame 411 surrounding the laminate 406, such as depicted in FIG. 4A. The solar cells 408 can face the front side 402 and be arranged into a plurality of solar cell strings 409. The laminate 406 can include one or more encapsulating layers which surround and enclose the solar cells 408. In various embodiments, the laminate 406 comprises a top cover 403 made of glass or another transparent material on the front side 402. The laminate 406 can further comprise a backsheet 405 on the back side 404.

The solar cells 410 in FIG. 4A can be connected to each other into strings 409 via ECB in the PV test piece 400. The sensors 360 from FIG. 3 may be above, below or otherwise around the ECB connections or interfaces 460 in order to detect voltage, current, temperature, smoke, etc. from the ECB interface 460 during testing.

FIG. 4B illustrates a top down view of a PV test piece 400 with PV cells 410 where the PV cells use ECB to electrically connect them to each other and which may be cyclically tested according to some embodiments. Labelled in FIG. 4B are shunts 430, bus bars 420, PV cells, diodes 440. ECB may be used to connect individual PV cells 410 in the PV panel test piece 400. The shunts may serve to prevent current flow between PV cells 410 while the diodes 430 may prevent reverse current flow. While being tested, sensors 360 from FIG. 3 may be located above each interface 460 between cells 410. These interfaces may contain ECB in order to electrically connect one cell 410 to an adjacent cell 410. The sensors 360 from FIG. 3 may be above, below or otherwise around the ECB connections or interfaces 460 in order to detect voltage, current, temperature, smoke, etc. from the ECB interface 460 during testing.

FIG. 4C illustrates a top down view of a multi-bus bar electronic test piece with electronic components where the multiple bus bars and/or other electronic components use ECB to electrically connect them to each other and which may be cyclically tested according to some embodiments. Labelled in FIG. 4C are bus bars 475, electronic components 470, ECB connections or interfaces 480, and diodes 490. ECB may be used to connect individual components 470 in the test piece 495. Shunts may serve to prevent current flow between components 470 while the diodes 490 may prevent reverse current flow. While being tested, sensors 360 from FIG. 3 may be located above each interface 480 between components 470. These interfaces may contain ECB in order to electrically connect one component 470 to an adjacent component 470. The sensors 360 from FIG. 3 may be above, below or otherwise around the ECB connections or interfaces 480 in order to detect voltage, current, temperature, smoke, etc. from the ECB interface 480 during testing.

Figure 5:
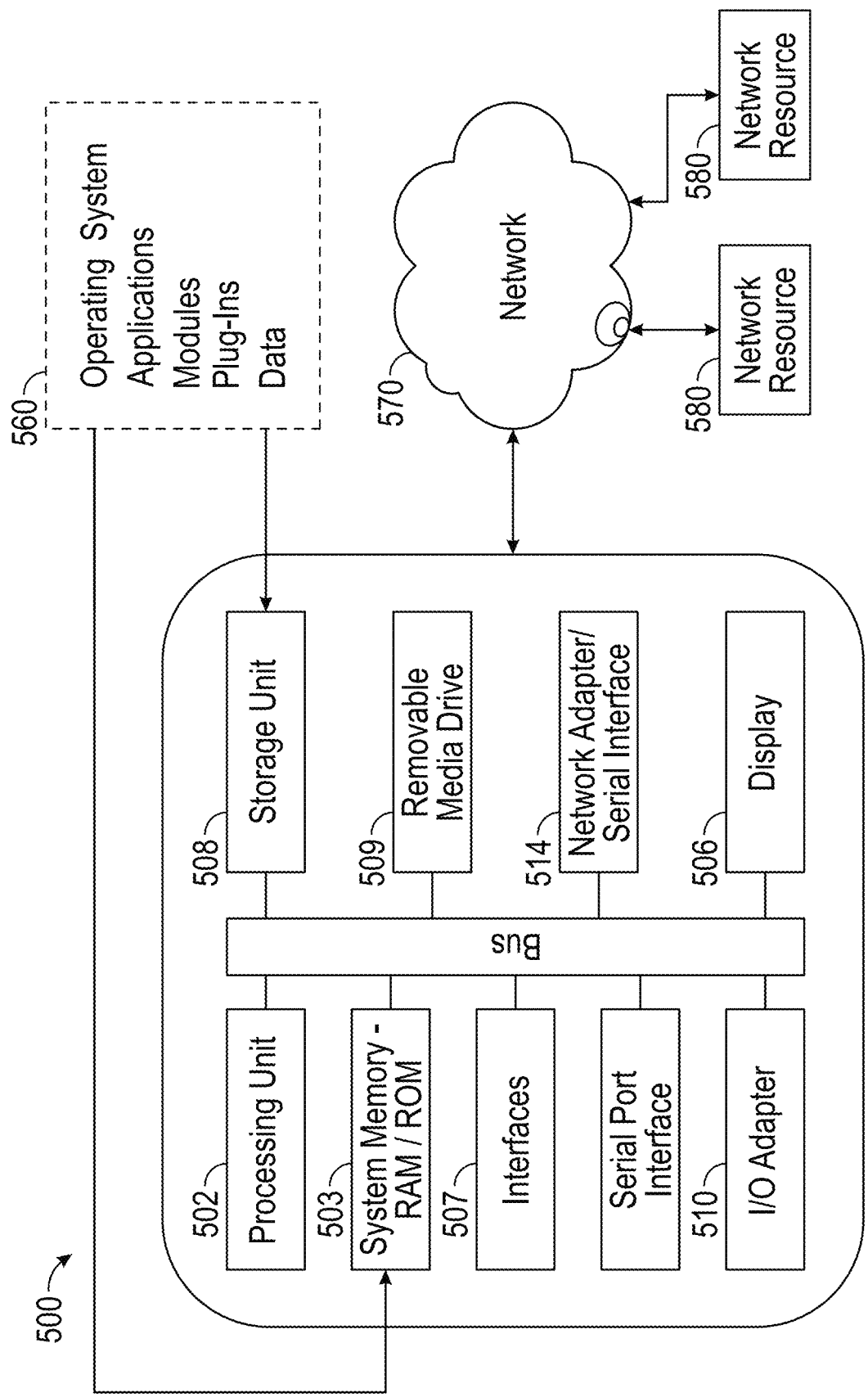
FIG. 5 illustrates a schematic of testing system components that may be employed to manage, report, or otherwise participate in cyclical testing of electrical connections in a test piece as may be employed according to some embodiments.

FIG. 5 illustrates a schematic of testing system components that may be employed to manage, report, or otherwise participate in cyclical testing of ECB connections in an electronic test piece as may be employed according to some embodiments. The interface or controller of FIG. 3 is shown with block diagram components at 500 of FIG. 5. FIG. 5 illustrates a basic block diagram of computer hardware according to some embodiments. An interface or controller 500 includes a CPU 502 and a main system memory 503 connected to a bus 504. The CPU 502 may be based on the 32-bit or 64-bit architecture and may be configured to perform any of the various functions or determinations described herein. A display 506 such as a liquid crystal display (LCD) may be connected to the bus 504 via a display controller. The display 506 is used to display, for management of computers or user interface or for other reasons as well, information using an appropriate graphics interface. A storage unit 508, such as a hard disk or solid-state drive, and a removeable media drive 509 such as a CD, DVD, or BD drive may be connected to the bus 504 via an SATA or IDE interface. Moreover, a keyboard and a mouse may be connected to the bus 504 via a keyboard-mouse I/O controller 510 or a USB bus or other interface 507. An operating system, other programs, and data (all shown in 560) are stored in the storage unit 508 to be loadable to the main memory 503. The removeable media drive 509 is used to install a program from a CD-ROM, DVD-ROM, or BD to the storage unit 508 as necessary. A communication interface 514 is based on, for example, the Ethernet (registered trademark) protocol. The communication interface 514 is connected to the bus 504 via a communication controller, and provides a network interface layer to the TCP/IP communication protocol of a communication function of the operating system of the interface or controller 500. In this case, the communication line may be a wired LAN environment or a wireless LAN environment based on wireless LAN connectivity standards, for example, IEEE 802.11a/b/g/n. The interface or controller 500 may be connected to a network 570 and to network resources 580. These network resources may provide target thresholds, instruction, or other data or information for running the cyclical testing of embodiments. Reports and real-time data may also be provided to these network resources regarding the feasibility, results, or other information about ECBs being tested.

Figure 6:
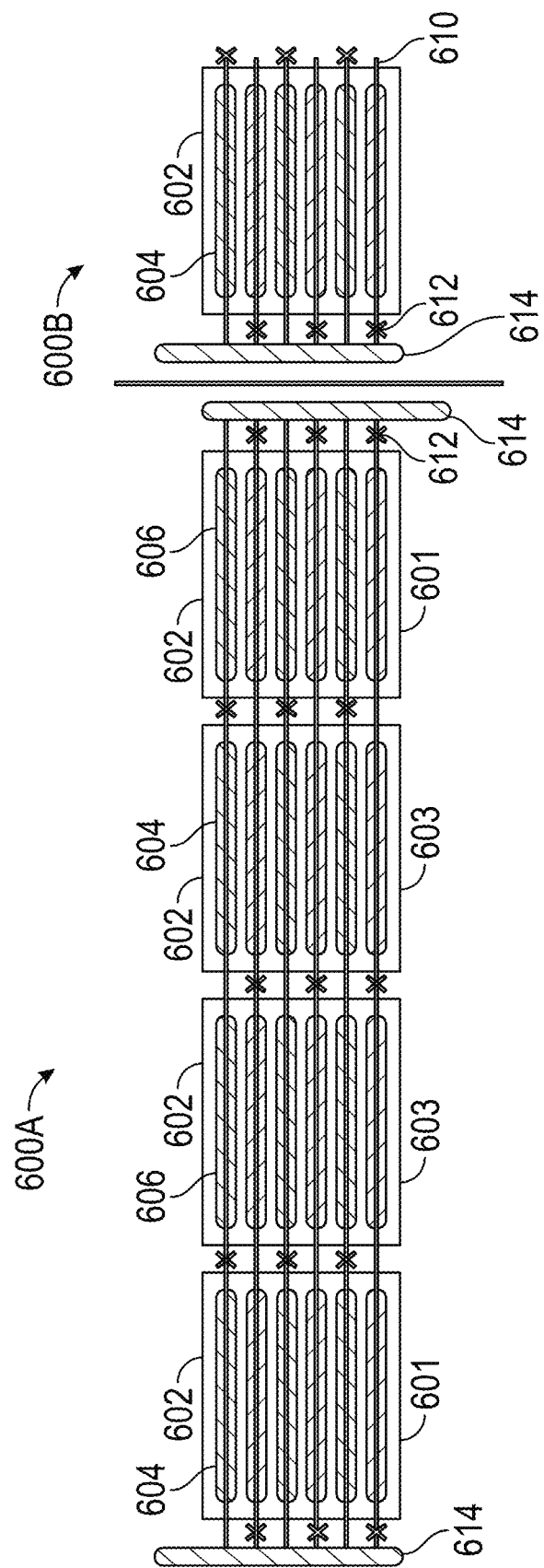
FIG. 6 illustrates wire structure connections as may be employed for testing according to some embodiments.

FIG. 6 illustrates wire structure connections with ECB as may be employed for testing according to some embodiments. The solar cell string 500A illustrated in FIG. 6 includes a plurality of solar cells 602 that are electrically coupled together in series. One or more connections shown in FIG. 6 may comprise ECB. The solar cell string 600A has two end solar cells 601, and inner solar cells 603 connected in series between the two end solar cells 601. Each of the two end solar cells 601 is electrically coupled with a busbar 614. At each of the end solar cells 601, every other one of the wires is coupled with a busbar 614 to couple only one of the two electrodes of the end solar cell, either the P-type doped diffusion regions 604 or the N-type doped diffusion regions 606. In one embodiment, the coupling of every other one of the wires from an end solar cell 601 with a busbar 614 can be achieved by first cutting all the wire at each end of the string, and connecting only the wires for either the P-type or N-type doped diffusion regions. Alternatively, all the wires for an end solar cell 601 can first be connected to a busbar 614, and then every other wire can be cut.

Only the end solar cells 601 are connected to a busbar 614, in contrast to other stringing techniques which can involve attaching busbar(s) to each solar cell, according to some embodiments. The busbars 614 can couple the solar string 600A with another solar string (e.g., such as the solar string 600B), or to another circuit (e.g., a circuit outside the module through a junction box).

As illustrated in FIG. 6, in one embodiment, a given cut section of wire is to electrically couple at most two solar cells together in series, wherein the P-type doped diffusion area of one of the two solar cells is connected to the N-type doped diffusion area of the other solar cell. However, other embodiments can include more than two solar cells being coupled together with a given cut section of wire. For example, if solar cells are connected in parallel, it is possible to connect more than two cells with a given cut section of wire.

Also as illustrated in FIG. 6, as may be employed in certain embodiments, a cut section of wire that electrically couples an end solar cell 601 to the busbar 614, couples a single solar cell to the busbar 614. However, as mentioned above, in embodiments that connect solar cells in parallel, a given cut section of wire can connect more than a single solar cell to the busbar. Thus, a solar string, hypercell, or super cell, can be created using the plurality of wires 610 by aligning and bonding the wires over the P-type and N-type doped diffusion regions of each of the solar cells using ECB, followed by cutting some of the wires to achieve the desired configuration of solar cells in a string. Thus, in accordance with one or more embodiments of the present disclosure, a stringing method provides a structure having compressed wires where every second wire is cut between wafers and bus bars at ends. It is to be appreciated that portions of the compressed wires between solar cells are not compressed. In an embodiment, the wires that are not cut between solar cells have a different cross-section on the solar cells than between the solar cells.

Figure 7A:
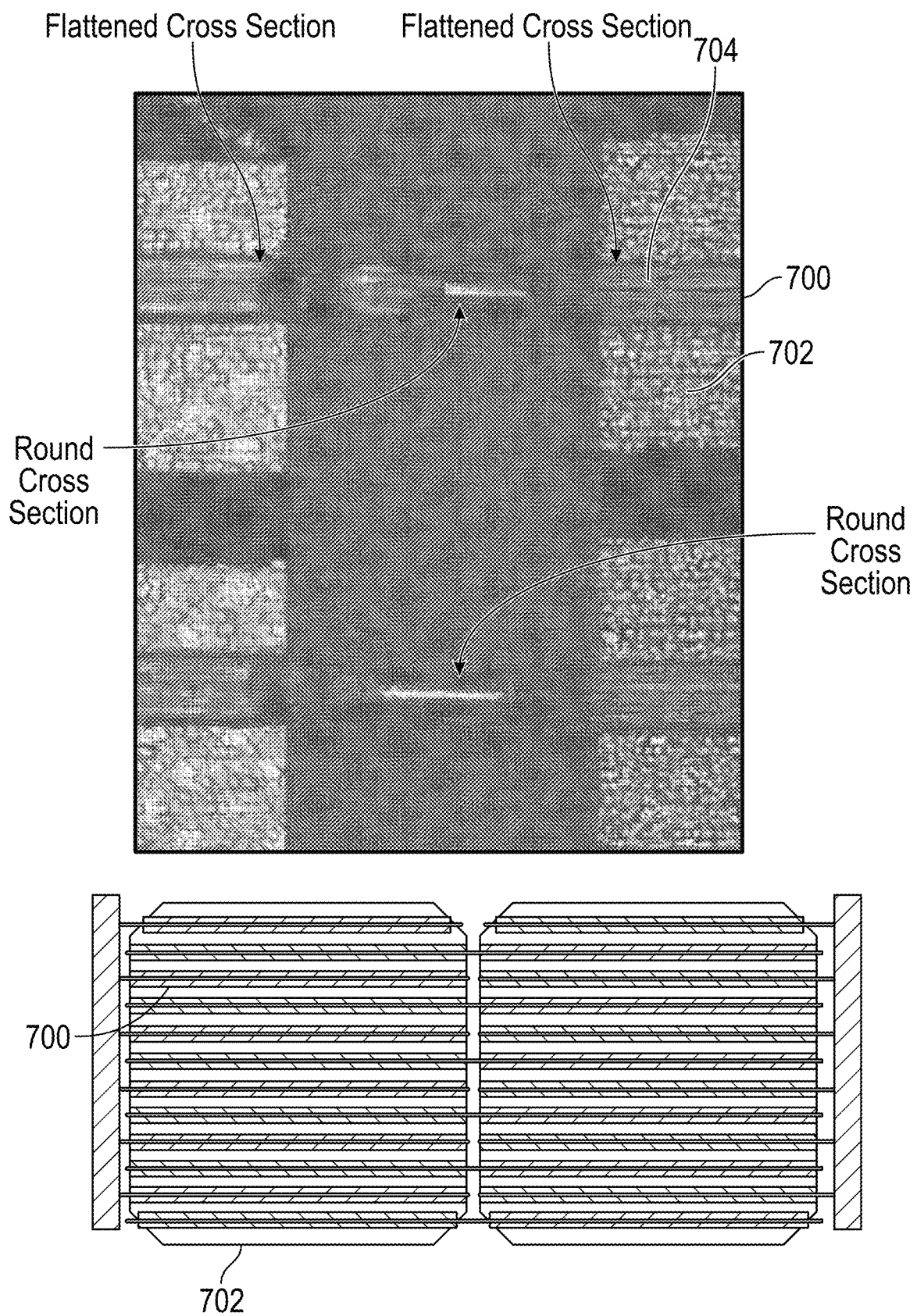
FIGS. 7A-7B illustrate wire structure connections as may be employed for testing according to some embodiments.
Figure 7B:
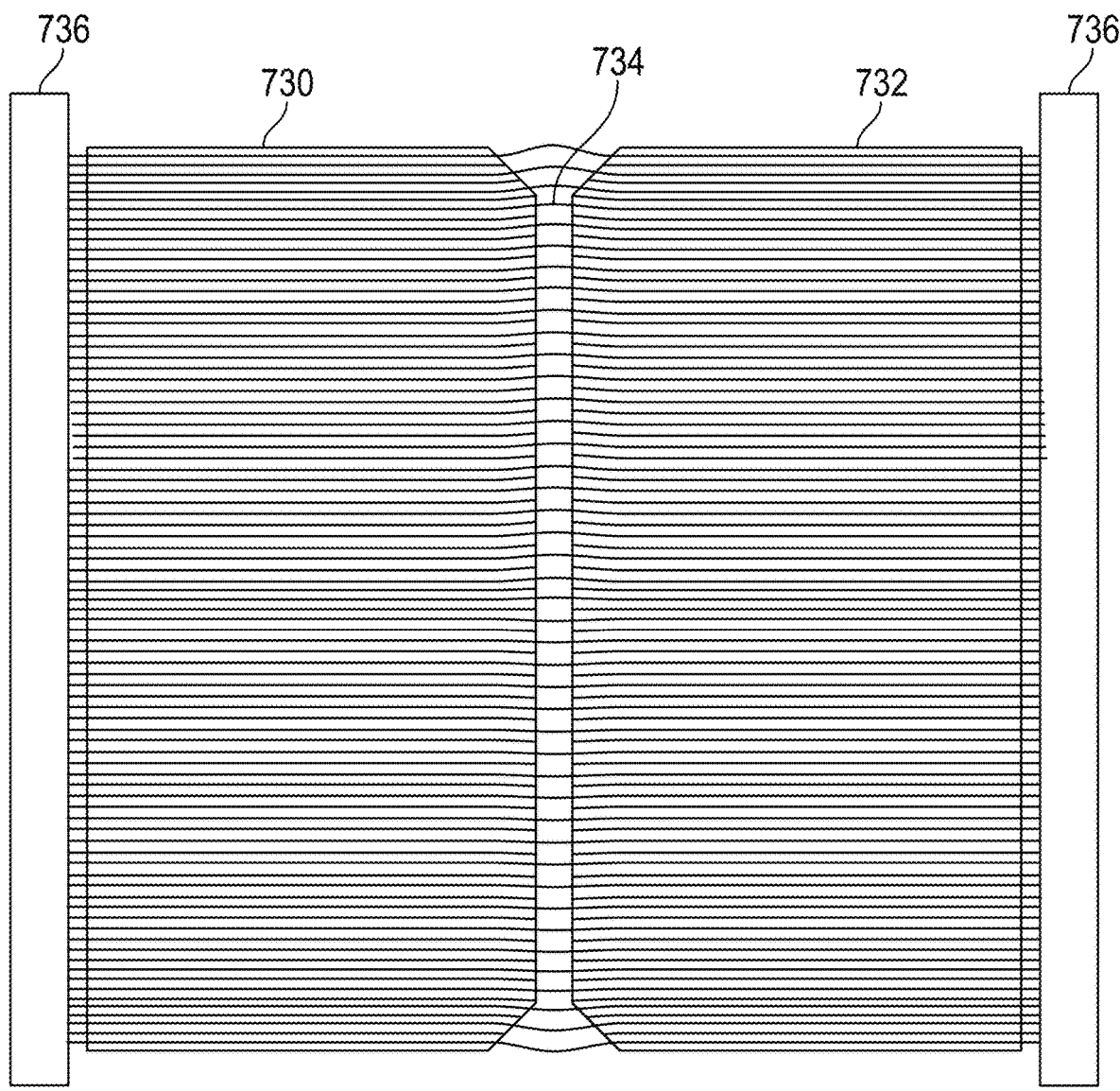

FIGS. 7A-7B illustrate wire structure connections that can comprise ECB and may be employed for testing according to some embodiments. Solar cells 702 include wires 700 thereon and there between. In one such embodiment, every other wire 700 is cut between cells 702. For wires that are not cut, the wire 700 has an essentially circular cross-sections between solar cells 702, and has a flattened circular cross-sectional profile on the solar cell 702 where the wires 700 have been compressed (e.g., thermally or ultrasonically) to the solar cells 702. In an embodiment, each wire 700 has a surface with microgrooves 704 along a length of the wire 700, as is depicted. In one such embodiment, the microgrooves 704 are formed in the wires 600 by a wire guide during guiding of the wires 700 in alignment with the cells 602. In FIG. 7B, a first half solar cell portion 730 is interconnected to a second half solar cell portion 732 by wires 734. In an embodiment, wires 734 include a strain relief features between cells 730 and 732, where every second wire is cut and the wires are bent in the plane of the cells 730 and 732. As described in association with FIG. 7A, in accordance with an embodiment of the present disclosure, the portions of wires 734 between cell portions 730 and 732 are essentially round and smooth, while the portions of wires 734 are flattened to a certain extent and have microgrooves formed therein. In an embodiment, as is depicted, each of the half solar cell portions 730 and 732 has an associated busbar 736. These wires 734 may be connected to busbar 736 using ECB.

Figure 8:
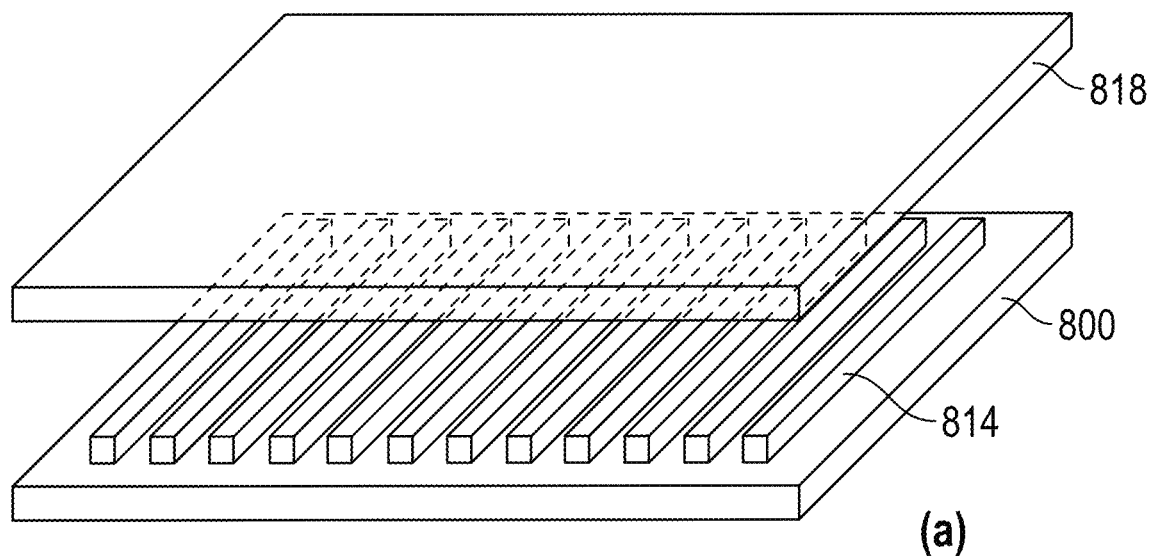
FIG. 8 illustrates foil structure connections as may be employed for testing according to some embodiments.
Figure 8:
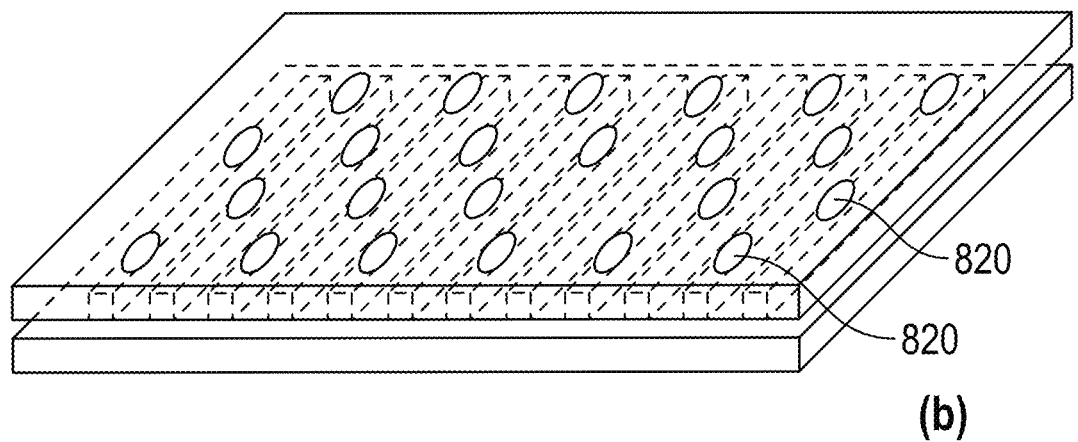
Figure 8:
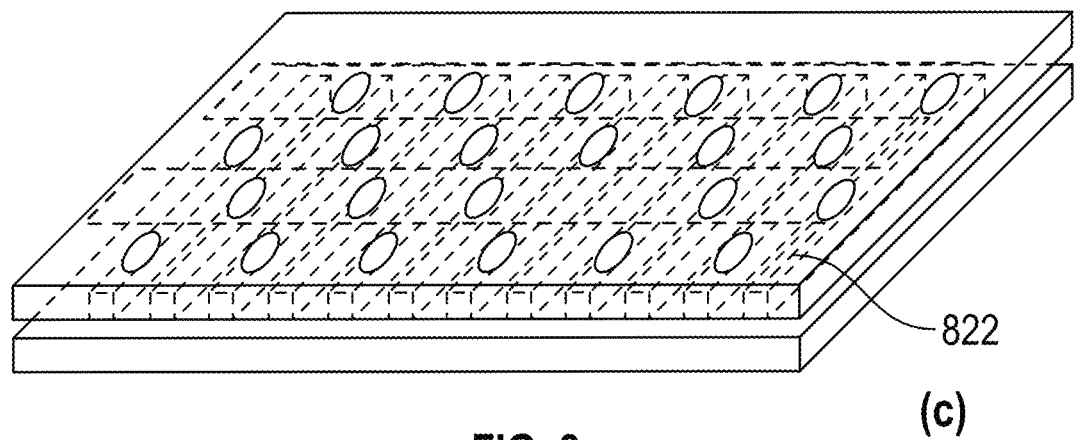

FIG. 8 illustrates foil structure connections that may comprise ECB and may be employed for testing according to some embodiments. FIG. 8 illustrates cross-sectional views of various stages in the fabrication of solar cells using anodized foil-based metallization. Referring to part (a) of FIG. 8, an anodized aluminum foil 818 is fit-up with substrate 800 having a plurality of metal seed regions 814 disposed thereon. Referring to part (b) of FIG. 8, laser welding is performed to generate weld spots 820 adhering the foil 818 to the metal seed region 814. Referring to part (c) of FIG. 8, laser patterning is performed to provide laser grooves 822. In certain embodiments, the pattern of the grooves is perpendicular to the pattern of the metal seed regions 814. In certain embodiments, the laser ablation stops on an anodized bottom surface of the metal foil 818. As noted, ECB may be employed on one or more of the connections in embodiments identified in FIG. 8.

Figure 9:
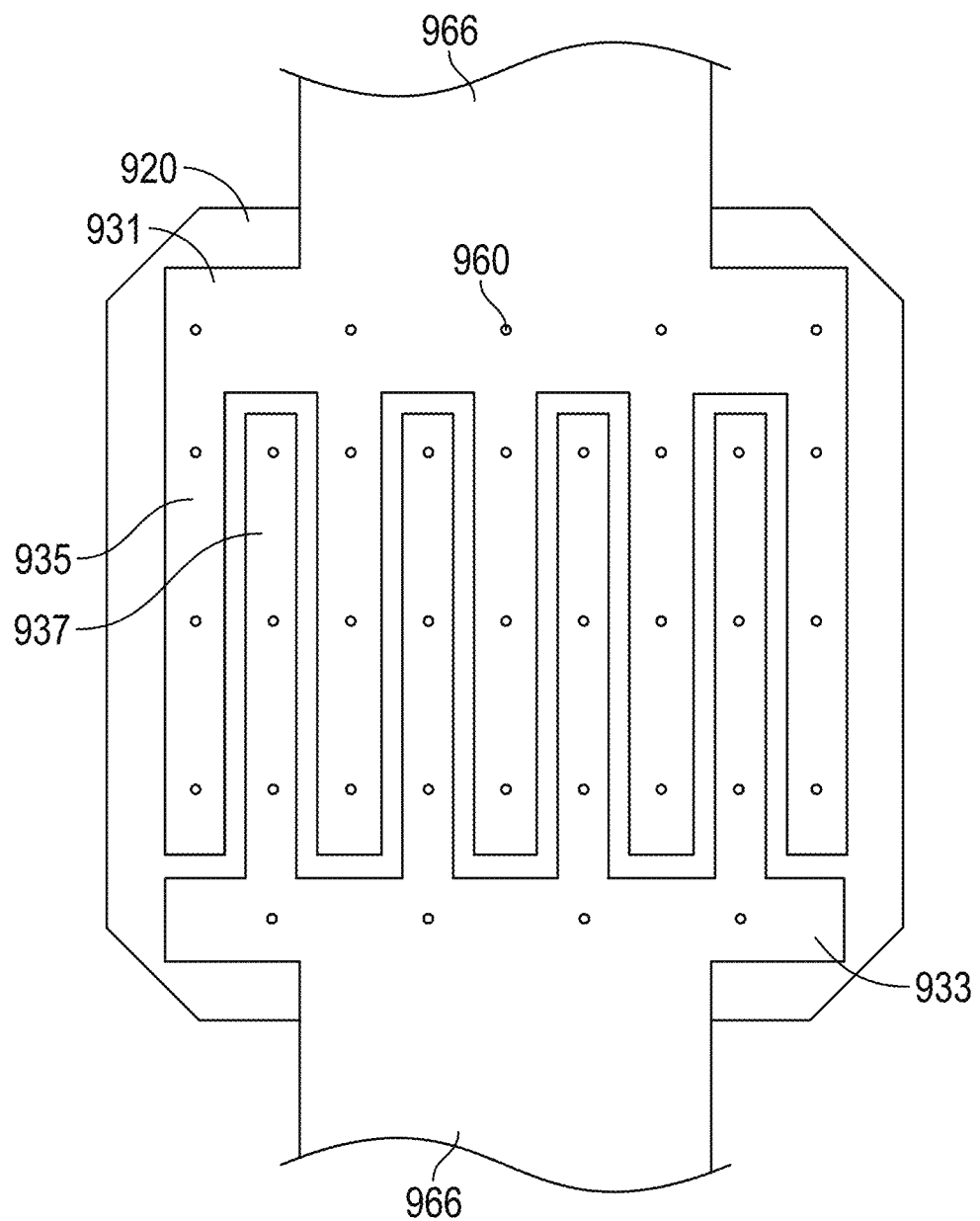
FIG. 9 illustrates foil structure connections as may be employed for testing according to some embodiments.

FIG. 9 illustrates foil structure connections that may comprise ECB and may be employed for testing according to some embodiments. FIG. 9 shows interconnects 931 and 933, which may be interleaved with each other and may be connected electrically using ECB. Tines 935 and 937 of the interconnects are shown to be interleaved with each other in FIG. 9. Also labelled in FIG. 9 are substrate 920 and leads 966. The substrate may comprise ECB in embodiments. ECB may be placed over the tines 935 and 937 to promote an electrical pathway between them and/or to secure the tines to each other and the substrate 920.

Figure 10A:
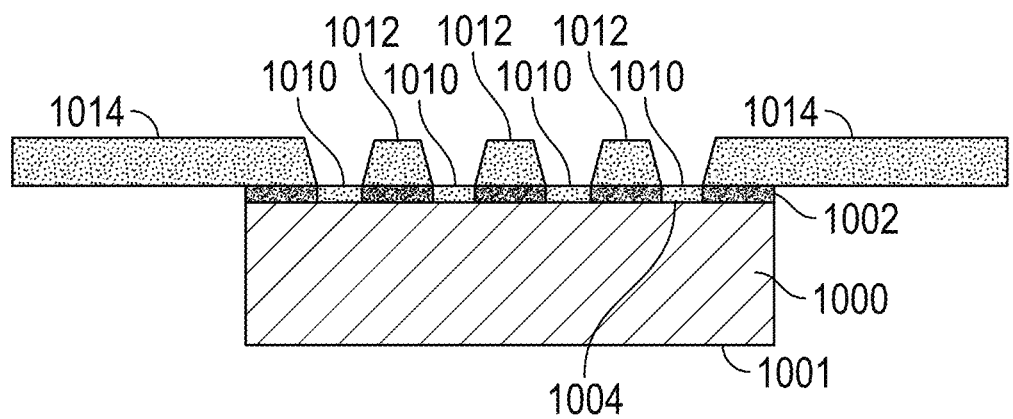
FIGS. 10A-10B illustrate foil structure connections as may be employed for testing according to some embodiments.
Figure 10B:
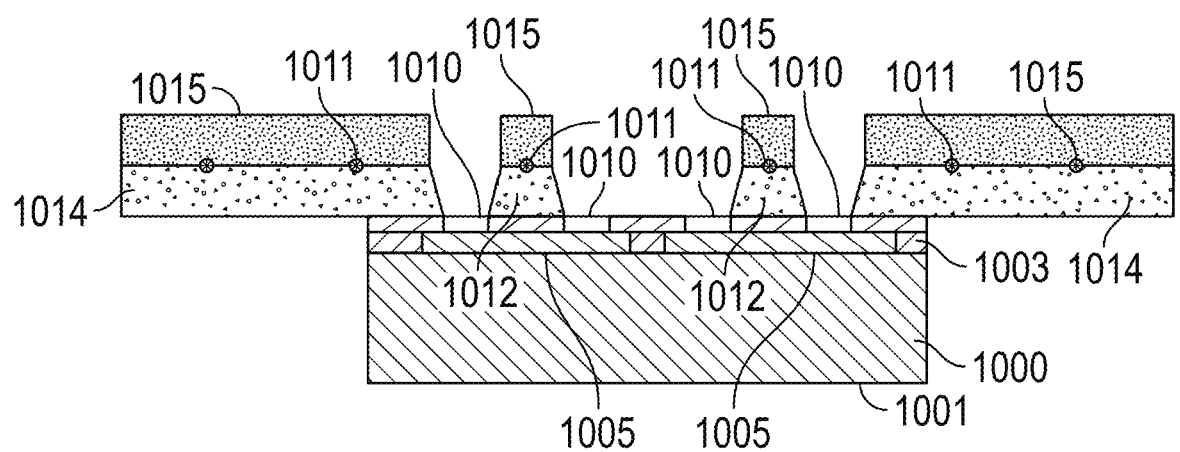

FIGS. 10A-10B illustrate foil structure connections that may comprise ECB and may be employed for testing according to some embodiments. These foil structure connections may be formed through laser etching and may comprise ECB that is tested according to embodiments. Exposing metal foil to a laser beam forms a plurality of conductive contact structures 1010 electrically connected to the semiconductor regions in or above the substrate 1000. As shown, the edge portions 1014 can also be referred to as interconnect portions that can electrically connect one solar cell to another solar cell. In one example, coupling one solar cell to another solar cell in this manner can form a solar cell string, achieving a parallel or series electrical relationship between the cells. In a particular embodiment, the overhang portion can represent a foil portion that is sufficiently large to overlap with one or more additional cells for metallization of the one or more additional cells. In an example, a single piece and/or sheet of foil can be used for a plurality of solar cells (e.g., 2, 3 or more solar cells) in this manner. In an embodiment, two or more cells can be connected together by their respective edge portions 1014. For example, the edge portions 1014 from adjacent cells can be connected by various processes employing ECB. In another example, substrates 1000 can have individual edge portions 1014. These individual edge portions 1014 can be bonded and/or welded together to electrically connect one substrate to another, e.g., to form a solar cell string such as a super cell or hypercell. In some examples, the individual edge portions 1014 can be attached together using a conductive adhesive, tacking process, stamping process and/or any other type of applicable attachment process. Also labelled in FIGS. 10A and 10B are contact structures 1010, intervening layer 1002, light receiving side 1001, metal source 1015, bond 1011, metal foil portion 1012, and metal foil portion 1003. In some embodiments, ECB may be employed on one or more of these connections and may be tested as provided herein.

Figure 11A:
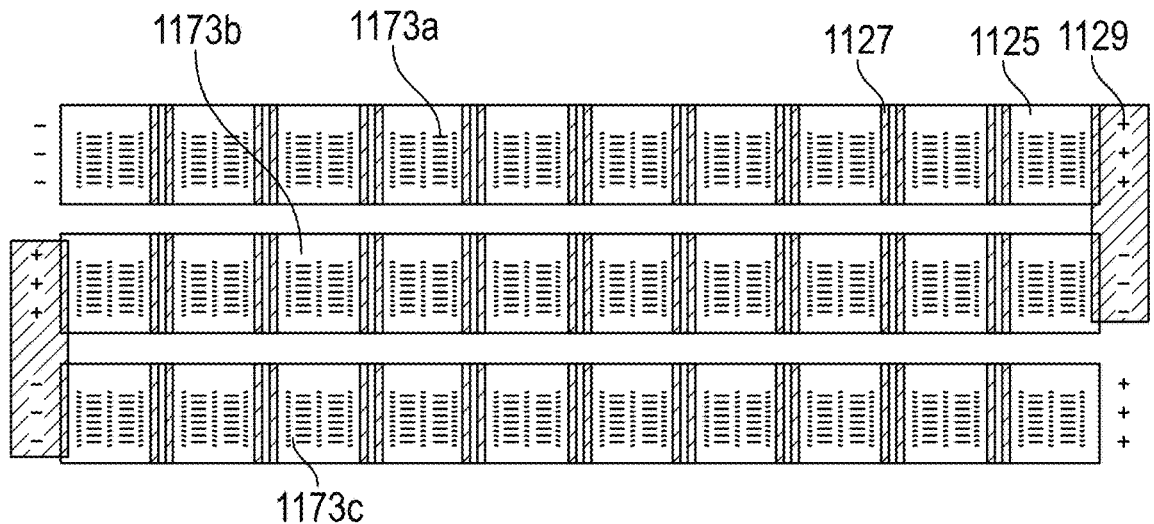
FIGS. 11A-11B illustrate foil structure connections as may be employed for testing according to some embodiments.
Figure 11B:
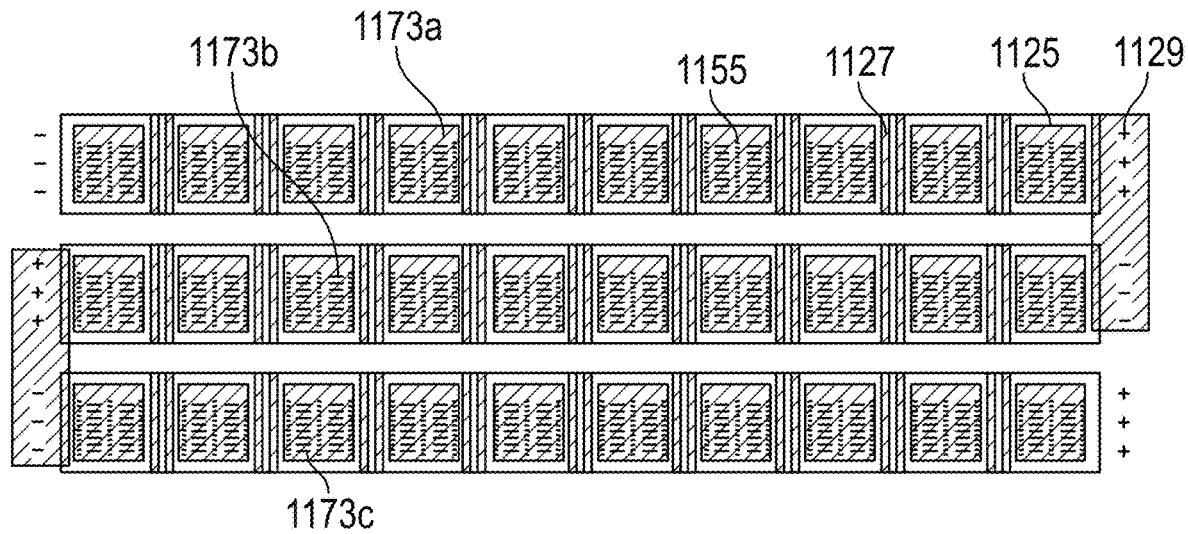

FIGS. 11A-11B illustrate foil structure connections that may comprise ECB and may be employed for testing according to some embodiments. In FIG. 11A, a substantial portion of the metal foil disposed over individual solar cells 1125 can be removed. In an example, portions of metal foil 1127 located between adjacent solar cells 1125 can be maintained to create a set of three solar cell strings 1173a, 1173b, 1173e connected in series using ECB. Although, in an embodiment, three solar cell strings 1173a, 1173b, 1173e are shown. A plurality of solar cell strings, e.g., one, two, three, four or more solar cells strings can be connected in this manner. In an embodiment' the portions of metal foil 1127 can be interconnecting portions 1127 or referred to as interconnects 1127. In an embodiment, the interconnecting portions 1127 can be disposed partially over edges of the solar cells 1125 and as well as disposed between solar cells 1125 and may be connected using ECB. Busbar portions 1129, can connect two or more solar cell strings together as shown using ECB. In an example, the busbar portion 1129 can connect the solar cell strings 1173a, 1173b, 1173e in series or parallel arrangements. In certain embodiments, the methods described herein can include forming the interconnecting portions 1127, busbar portions 1129 and/or other portions from the metal foil. For example, with the interconnecting portions 1127 and Busbar portions 129 can include conductive contact structures comprising ECB. The busbar portions 1129 can be rolled, folded and/or trimmed in a subsequent process, after a LAMP technique is applied. By rolling, folding or trimming the busbar portions 1129, a space between a solar cell 1125 and an edge of module constructed therefrom can be minimized. As noted, in some embodiments, ECB may be employed on one or more of these connections and may be tested as provided herein.

As shown in FIG. 11B, the metal foil can be used to form conductive contact structures 1155 as well as provide interconnecting portions 1127 between adjacent solar cells solar cell 1125 and busbar portions 1129 between solar cell strings 1173a, 1173b, 1173e. For example, with the conductive contact structures 1155 can include conductive contact structures comprising ECB. Thus, for example, a single foil sheet can be used to provide both connections between solar cells 1127 and localized metallization 155 to the individual solar cells as well as busbar portions 129 between solar cell strings. As noted, in some embodiments, ECB may be employed on one or more of these connections and may be tested as provided herein.

Figure 12:
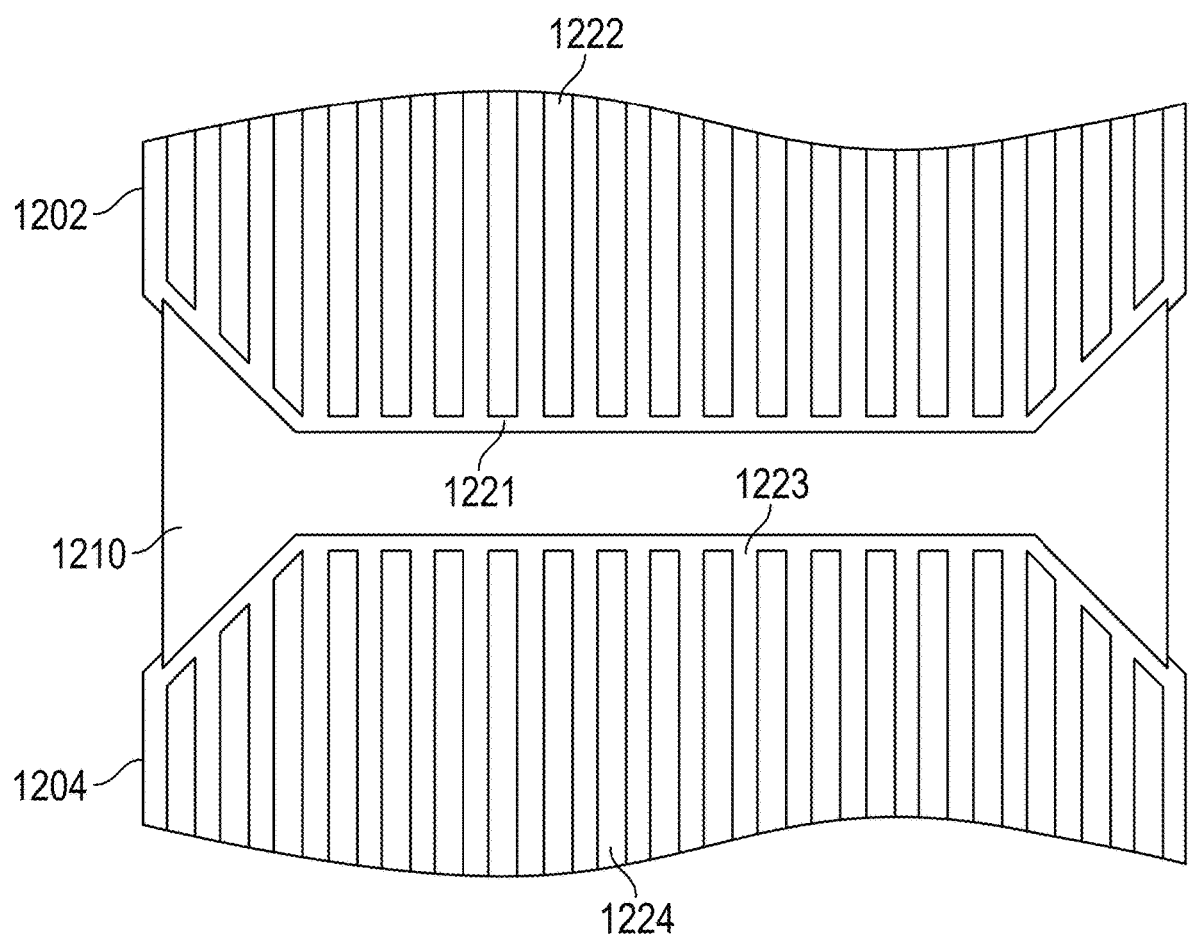
FIG. 12 illustrates a dog bone connection as may be employed for testing according to some embodiments.

FIG. 12 illustrates a dog-bone connection that may comprise ECB and may be employed for testing according to some embodiments. The first interconnect 1210 can have a dog-bone shape as shown. FIG. 12 is a single interconnect having that shape rather than multiple interconnects collectively having that shape. As shown, the solar cells in the example of FIG. 12 are pad-less solar cells 1202, 1204. In an embodiment, the first interconnect 1210 can be welded with ECB to metal regions 1221, 1223 of the solar cells 1202,1204. In some embodiments, a laser process can be used to weld the first interconnect 1210 to metal regions 1221, 1223 of the first and second solar cell 1202, 1204. In an example, the metal regions 1221, 1223 can include contact fingers 1222, 1224. In embodiments, first interconnect 1210 can be aluminum. In embodiments, the first interconnect 1210 can be substantially planar with the metal regions 1221, 1223 and/or the first and second solar cell 1202, 1204. In one embodiment, to connect pad-less solar cells 1202, 1204 together, a tab-less interconnect can be used, such as the one illustrated in FIG. 12. In embodiments, the first interconnect 1210 can have a layer of nickel and/or zincate. In embodiments, the layer of nickel and/or zincate can be formed by a cladding process. As noted, in some embodiments, ECB may be employed on one or more of these connections and may be tested as provided herein.

Figure 13:
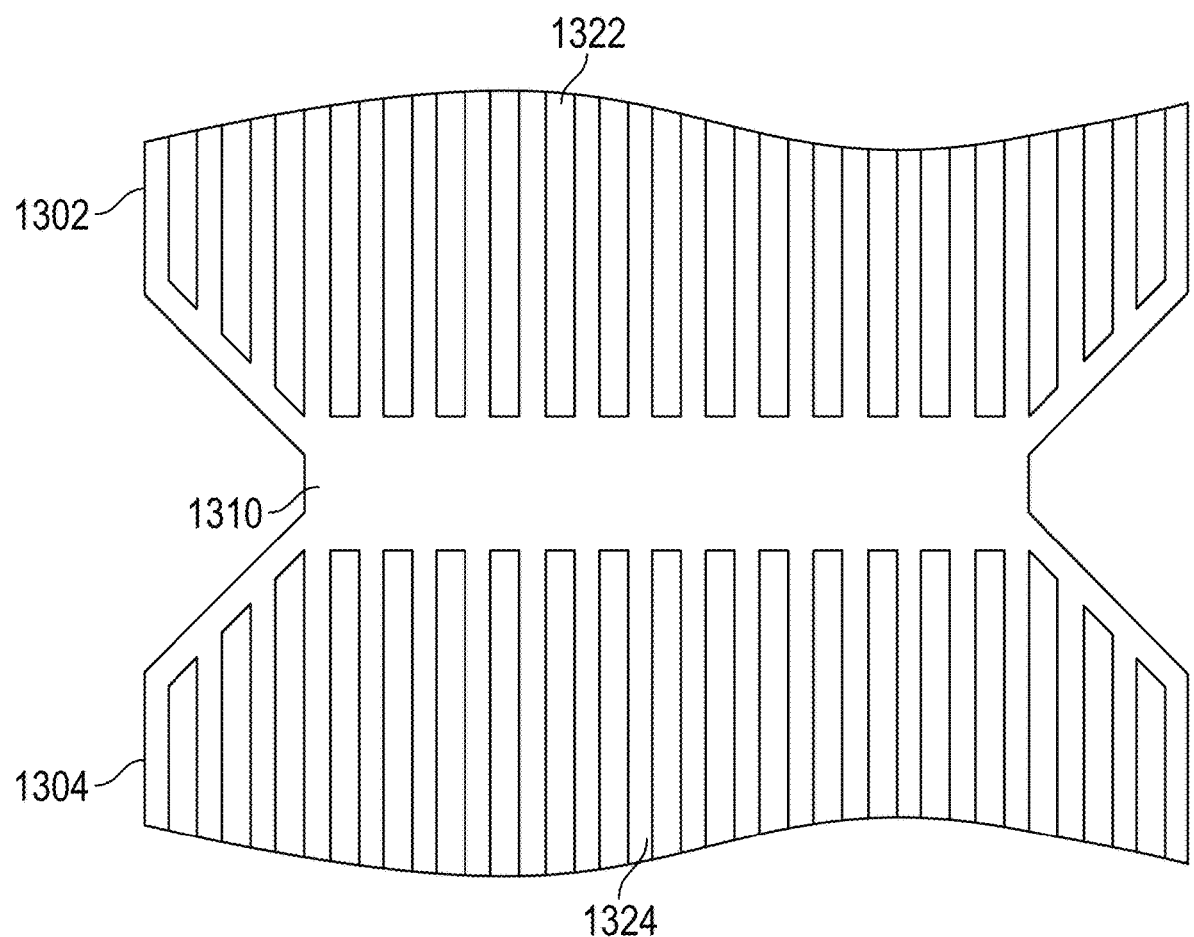
FIG. 13 illustrates a foil connection as may be employed for testing according to some embodiments.

FIG. 13 illustrates a foil connection that may comprise ECB and may be employed for testing according to some embodiments. An example of solar cells connected together by a conductive foil having an anodized region is shown, according to some embodiments. FIG. 13 shows the solar cells 1302, 1304 from back sides of the solar cells 1302, 1304, where the solar cells 1302, 1304 can have front sides which face the sun during normal operation and back sides is opposite the front sides. In an embodiment, the conductive foil 1310 can connect a first solar cell 1302 to a second solar cell 1304. As shown, the solar cells 1302, 1304, in the example of FIG. 13 are pad-less solar cells 1302, 1304. In embodiments, the conductive foil 1310 can include contact fingers 1322, 1324. In embodiments, conductive foil 1310 can be aluminum and can be an aluminum foil. In some embodiments, the conductive foil 1310 can be rolled over from the first solar cell 1302 to the second solar cell 1304. In some embodiments, a laser process can be used to weld the conductive foil 1310 to the first and second solar cell 1302, 1304. In embodiments, the conductive foil 1310 can have a layer of nickel and/or zincate. In embodiments, the layer of nickel and/or zincate can be formed by a cladding process. As noted, in some embodiments, ECB may be employed on one or more of these connections and may be tested as provided herein.

Figure 14:
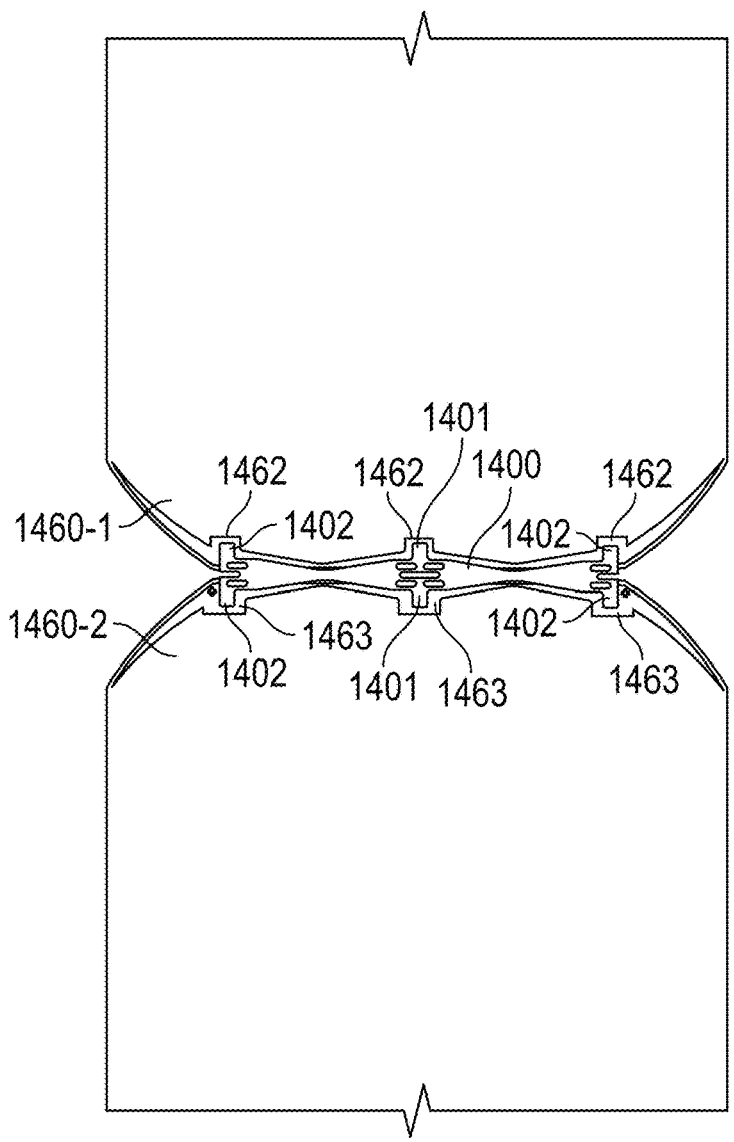
FIG. 14 illustrates a dog bone connection as may be employed for testing according to some embodiments.

FIG. 14 illustrates a dog-bone connection that may comprise ECB and may be employed for testing according to some embodiments. In the example of FIG. 14, tabs 1402 and 1401 of the interconnect 1400, electrically connect positive pads 1463 of the solar cell 1460-2 to the negative pads 1462 of the solar cell 1460-1, on the back sides of the solar cells. As is well understood, the front side of a solar cell faces the sun to collect solar radiation during normal operation; the back side is opposite the front side. As noted, in some embodiments, ECB may be employed on one or more of these connections and may be tested as provided herein.

Figure 15:
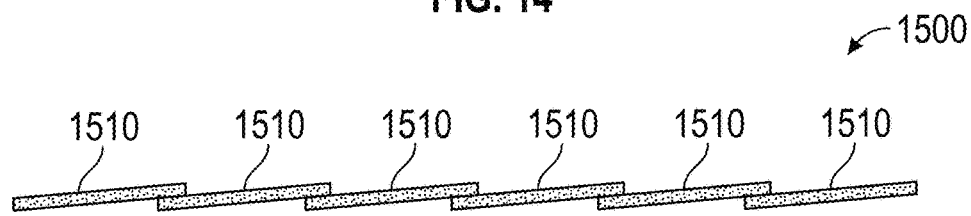
FIG. 15 illustrates a shingled cell string as may be employed for testing according to some embodiments.

FIG. 15 illustrates a shingled cell string, i.e., a hypercell or super cell, which may be employed for testing according to some embodiments. Included in FIG. 15 is a cross-sectional view of a string of series-connected solar cells 1510 arranged in a shingled manner with the ends of adjacent solar cells overlapping and electrically connected to form a super cell 1500. Each solar cell 1510 comprises a semiconductor diode structure and electrical contacts to the semiconductor diode structure by which electric current generated in solar cell 1510 when it is illuminated by light may be provided to an external load.

In some implementations, each solar cell 1510 is a crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, any other suitable solar cells employing any other suitable material system, diode structure, physical dimensions, or electrical contact arrangement may be used instead of or in addition to solar cells 10 in the solar modules described in this specification. For example, the front (sun side) surface metallization pattern may be disposed on a semiconductor layer of p-type conductivity, and the rear (shaded side) surface metallization pattern disposed on a semiconductor layer of n-type conductivity. Referring again to FIG. 15, in super cell 1500 adjacent solar cells 1510 are conductively bonded to each other in the region in which they overlap by an ECB that electrically connects the front surface metallization pattern of one solar cell to the rear surface metallization pattern of the adjacent solar cell. The connections of this super cell 1500 may contain ECB, which may be tested in certain embodiments.

Figure 16:
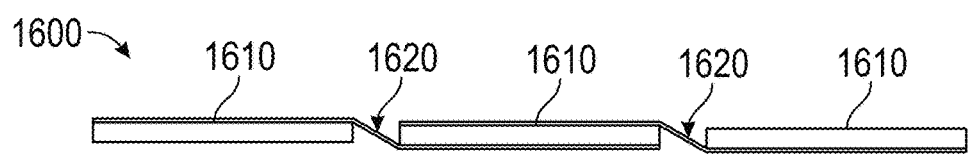
FIG. 16 illustrates a string of solar cell connected by ribbons according to some embodiments.

FIG. 16 depicts a string 1600 of solar cells 1610 electrically interconnected in series by the ribbons 1620. Specifically, ribbons 1620 can interconnect one or more electrodes formed on the front surface of one solar cell 1610 and one or more electrodes formed on the back surface of another adjacent solar cell 1620 via ECB (e.g. soldering, conductive adhesive, etc.). The connections of this string 1600 may contain ECB, which may be tested in certain embodiments.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An electrically conductive bond test management controller comprising:
a processing unit; and
system memory,
wherein the system memory comprises instructions, which when executed, cause the processing unit to perform functions comprising:
determining whether a number of complete test cycles of one or more electrically conductive bond (ECB) of an ECB test piece has been reached or has not been reached, the ECB test piece located in a test chamber;
if a determination is made that the number of complete test cycles has not been reached, performing a no current test on the ECB test piece for a first period of time and performing an imposed current test on the ECB test piece during a second period of time,
during the imposed current test, receiving and analyzing signals from thermal sensors and voltage sensors or current sensors, the thermal sensors and voltage sensors or current sensors sensing temperature, and voltage or current, of one or more ECB connections on the ECB test piece; and
commanding a power supply to provide a high-current to the one or more ECB connections, the high-current exceeding the maximum short-circuit current for at least one ECB connection of the one or more ECB connections.

2. The controller of claim 1 wherein the system memory further comprises instructions, which when executed, cause the processing unit, during the imposed current test, to compare the received signals to a safety value, and when a received signal exceeds a safety value threshold, to stop commanding the power supply to provide the high-current.

3. The controller of claim 1 wherein the second time period is longer than the first time period.

4. The controller of claim 1 wherein the system memory further comprises instructions, which when executed,
cause the processing unit to determine the temperature, during the no current test, and
to maintain active operation of a cooling system in the test chamber,
the cooling system sized to lower the temperature of one or more ECB connections on the ECB test piece.

5. The controller of claim 1 wherein instructions, which when executed, cause the processing unit to perform functions further comprising: determining the temperature and voltage or current for each ECB connection of the ECB test piece.

6. The controller of claim 1 wherein the ECB test piece comprises a plurality of photovoltaic cells.

7. The controller of claim 1 wherein during the imposed current test, the signals from thermal sensors and voltage sensors or current sensors are received via a test chamber interface, the interface comprising a processing unit and electrically coupled to the thermal sensors, and the voltage sensors or the current sensors, of the test chamber.

8. The controller of claim 1 wherein the high-current exceeds three-times the maximum short-circuit current for at least one ECB connection of the one or more ECB connections.

9. The controller of claim 1 wherein the high-current exceeds six-times the maximum short-circuit current for at least one ECB connection of the one or more ECB connections.

10. An electrically conductive bond test manager system comprising:
a processing unit; and
system memory,
wherein the system memory comprises instructions, which when executed, cause the processing unit to perform functions comprising:
determining whether a number of complete test cycles of electrically conductive bonding (ECB) on an ECB test piece has been reached or has not been reached, the ECB test piece located in a test chamber;
if a determination is made that the number of complete test cycles has not been reached, performing a no current test on the ECB test piece for a first period of time and performing an imposed current test on the ECB test piece during a second period of time,
during the imposed current test, receiving and analyzing signals from thermal sensors and voltage sensors or current sensors, the thermal sensors and voltage sensors or current sensors sensing temperature, and voltage or current, of one or more ECB connections on the ECB test piece; and commanding a power supply to provide a high-current to the one or more ECB connections, the high-current exceeding the maximum short-circuit current for at least one ECB connection of the one or more ECB connections.

11. The system of claim 10 wherein the system memory further comprises instructions, which when executed, cause the processing unit, during the imposed current test, to compare the received signals to a safety value, and when a received signal exceeds a safety value threshold, to stop commanding the power supply to provide the high-current.

12. The system of claim 10 wherein the second time period is longer than the first time period.

13. The system of claim 10 wherein the system memory further comprises instructions, which when executed,
cause the processing unit to determine the temperature, during the no current test, and
to maintain active operation of a cooling system in the test chamber,
the cooling system sized to lower the temperature of one or more ECB connections on the ECB test piece.

14. The system of claim 10 wherein instructions, which when executed, cause the processing unit to perform functions further comprising: determining the temperature and voltage or current for each ECB connection of the ECB test piece.

15. The system of claim 10 wherein the ECB test piece comprises a plurality of photovoltaic (PV) cells.

16. The system of claim 10 wherein, during the imposed current test, the signals from thermal sensors and voltage sensors or current sensors are received via a test chamber interface, the interface comprising a processing unit and electrically coupled to the thermal sensors, and the voltage sensors or the current sensors, of the test chamber.

17. The system of claim 10 wherein the high-current exceeds three-times the maximum short-circuit current for at least one ECB connection of the one or more ECB connections.

18. The system of claim 10 wherein the high-current exceeds six-times the maximum short-circuit current for at least one ECB connection of the one or more ECB connections.

19. An electrically conductive bond (ECB) cyclical test process comprising:
determining whether a number of complete test cycles of an ECB photovoltaic (PV) test piece has been reached or has not been reached, the ECB PV test piece located in a test chamber;
if a determination is made that the number of complete test cycles has not been reached, performing a no current test on the ECB PV test piece for a first period of time and performing an imposed current test on the ECB PV test piece during a second period of time,
during the imposed current test, receiving and analyzing signals from thermal sensors and voltage sensors or current sensors, the thermal sensors and voltage sensors or current sensors sensing temperature, and voltage or current, of one or more ECB connections on the ECB PV test piece; and
commanding a power supply to provide a high-current to the one or more ECB connections, the high-current exceeding the maximum short-circuit current for at least one ECB connection of the one or more ECB connections.

20. The process of claim 19 further comprising during the imposed current test, comparing the received signals to a safety value, and when a received signal exceeds a safety value threshold, to stop commanding the power supply to provide the high-current.

\* \* \* \* \*